United States Patent
Liaw

(10) Patent No.: US 11,355,501 B2
(45) Date of Patent: Jun. 7, 2022

(54) METHOD FOR MANUFACTURING STATIC RANDOM ACCESS MEMORY DEVICE

(71) Applicant: TAIWAN SEMICONDUCTOR MANUFACTURING CO., LTD., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/005,770

(22) Filed: Aug. 28, 2020

(65) Prior Publication Data

US 2021/0050356 A1 Feb. 18, 2021

Related U.S. Application Data

(63) Continuation of application No. 15/811,426, filed on Nov. 13, 2017, now Pat. No. 10,763,266, which is a
(Continued)

(51) Int. Cl.
*H01L 21/00* (2006.01)
*H01L 27/11* (2006.01)
(Continued)

(52) U.S. Cl.
CPC ...... *H01L 27/1104* (2013.01); *H01L 21/0274* (2013.01); *H01L 21/0337* (2013.01);
(Continued)

(58) Field of Classification Search
None
See application file for complete search history.

(56) References Cited

U.S. PATENT DOCUMENTS

| 7,923,305 B1 | 4/2011 | Nguyen et al. |
| 8,368,182 B2 | 2/2013 | Lee et al. |

(Continued)

FOREIGN PATENT DOCUMENTS

| CN | 1385889 A | 12/2002 |
| CN | 1779903 A | 5/2006 |

(Continued)

OTHER PUBLICATIONS

Office Action issued in corresponding Korean Patent Application No. 10-2016-0036811, dated Dec. 14, 2017.
(Continued)

*Primary Examiner* — Reema Patel
(74) *Attorney, Agent, or Firm* — McDermott Will & Emery LLP

(57) ABSTRACT

In a method of manufacturing an SRAM device, an insulating layer is formed over a substrate. First dummy patterns are formed over the insulating layer. Sidewall spacer layers, as second dummy patterns, are formed on sidewalls of the first dummy patterns. The first dummy patterns are removed, thereby leaving the second dummy patterns over the insulating layer. After removing the first dummy patterns, the second dummy patterns are divided. A mask layer is formed over the insulating layer and between the divided second dummy patterns. After forming the mask layer, the divided second dummy patterns are removed, thereby forming a hard mask layer having openings that correspond to the patterned second dummy patterns. The insulating layer is formed by using the hard mask layer as an etching mask, thereby forming via openings in the insulating layer. A conductive material is filled in the via openings, thereby forming contact bars.

20 Claims, 19 Drawing Sheets

Related U.S. Application Data continuation of application No. 14/958,592, filed on Dec. 3, 2015, now Pat. No. 9,842,843.

(51) Int. Cl.
| | |
|---|---|
| *H01L 27/02* | (2006.01) |
| *H01L 21/28* | (2006.01) |
| *H01L 21/8238* | (2006.01) |
| *H01L 21/033* | (2006.01) |
| *H01L 21/027* | (2006.01) |
| *H01L 21/311* | (2006.01) |
| *H01L 21/768* | (2006.01) |
| *H01L 21/8234* | (2006.01) |
| *H01L 29/417* | (2006.01) |
| *H01L 29/66* | (2006.01) |

(52) U.S. Cl.
CPC .... *H01L 21/0338* (2013.01); *H01L 21/28132* (2013.01); *H01L 21/31144* (2013.01); *H01L 21/76802* (2013.01); *H01L 21/76877* (2013.01); *H01L 21/823431* (2013.01); *H01L 21/823475* (2013.01); *H01L 21/823821* (2013.01); *H01L 27/0207* (2013.01); *H01L 29/41791* (2013.01); *H01L 29/66545* (2013.01)

(56) References Cited

U.S. PATENT DOCUMENTS

| | | | |
|---|---|---|---|
| 8,822,137 B2 | 9/2014 | Lin et al. | |
| 9,576,953 B2 | 2/2017 | Baek et al. | |
| 9,831,253 B2 | 11/2017 | Liaw | |
| 9,842,843 B2 | 12/2017 | Liaw | |
| 10,763,266 B2 * | 9/2020 | Liaw | H01L 29/41791 |
| 2006/0084243 A1 | 4/2006 | Zhang et al. | |
| 2007/0215960 A1 * | 9/2007 | Zhu | H01L 29/0673 |
| | | | 257/414 |
| 2009/0061638 A1 | 3/2009 | Yi | |
| 2009/0215272 A1 * | 8/2009 | Sadjadi | H01L 21/0337 |
| | | | 438/703 |
| 2009/0321851 A1 * | 12/2009 | Awano | H01L 21/26506 |
| | | | 257/408 |
| 2010/0155906 A1 | 6/2010 | Lee et al. | |
| 2013/0292777 A1 | 11/2013 | Liaw | |
| 2014/0103450 A1 | 4/2014 | Cheng et al. | |
| 2015/0145008 A1 * | 5/2015 | Cheng | H01L 23/5384 |
| | | | 257/296 |
| 2015/0221644 A1 | 8/2015 | Baek et al. | |
| 2015/0243751 A1 * | 8/2015 | Liu | H01L 21/76897 |
| | | | 257/288 |

FOREIGN PATENT DOCUMENTS

| | | |
|---|---|---|
| KR | 10-2010-0075205 A | 7/2010 |
| KR | 10-2014-0080475 A | 6/2014 |
| KR | 10-2015-0091661 A | 8/2015 |

OTHER PUBLICATIONS

Notice of Allowance issued in corresponding U.S. Appl. No. 15/811,426, dated Apr. 24, 2020.

Non-Final Office Action issued in corresponding U.S. Appl. No. 15/811,426, dated Jan. 22, 2020.

Final Office Action issued in corresponding U.S. Appl. No. 15/811,426, dated Jul. 30, 2019.

Non-Final Office Action issued in corresponding U.S. Appl. No. 15/811,426, dated Jan. 28, 2019.

* cited by examiner

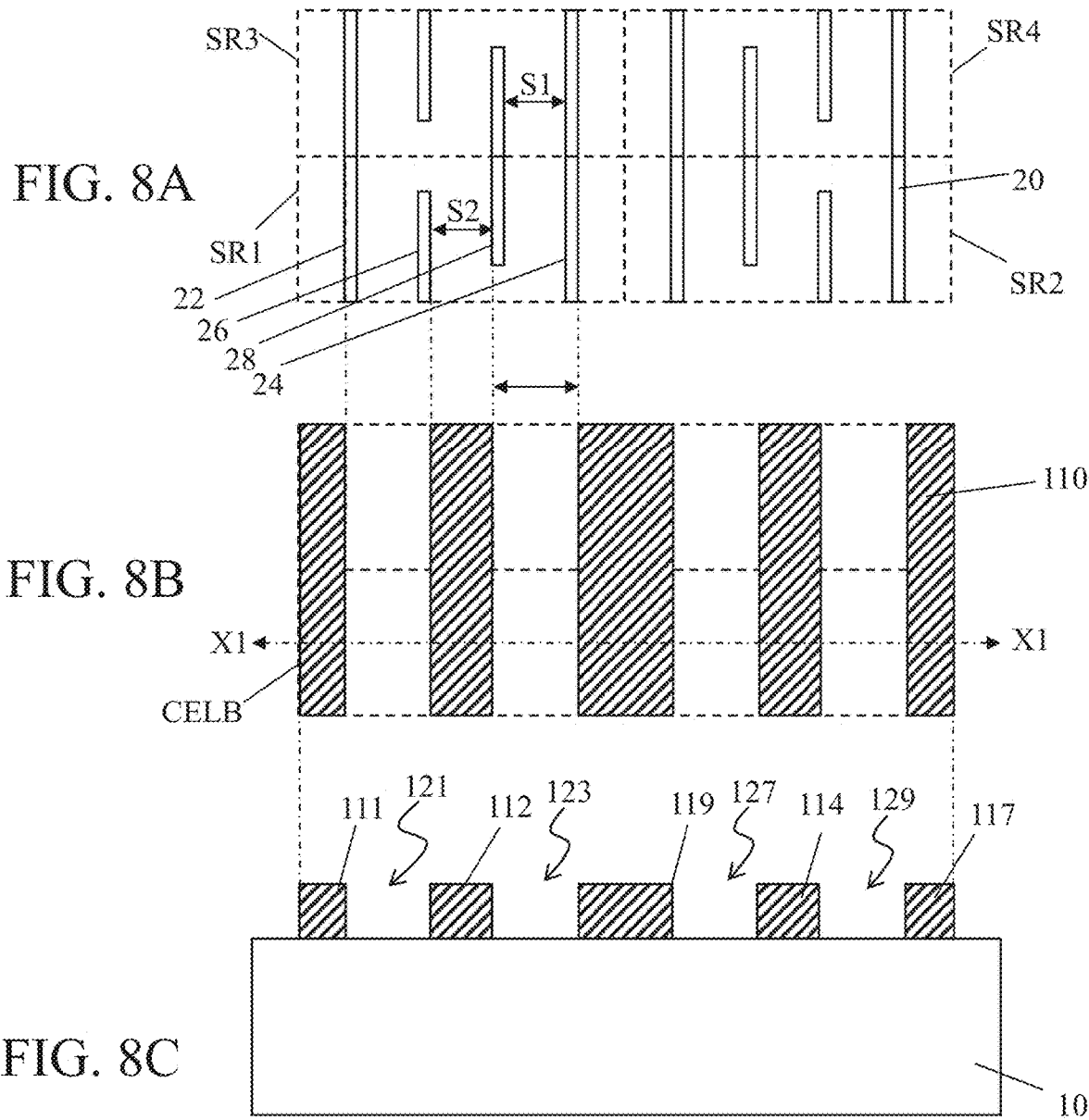

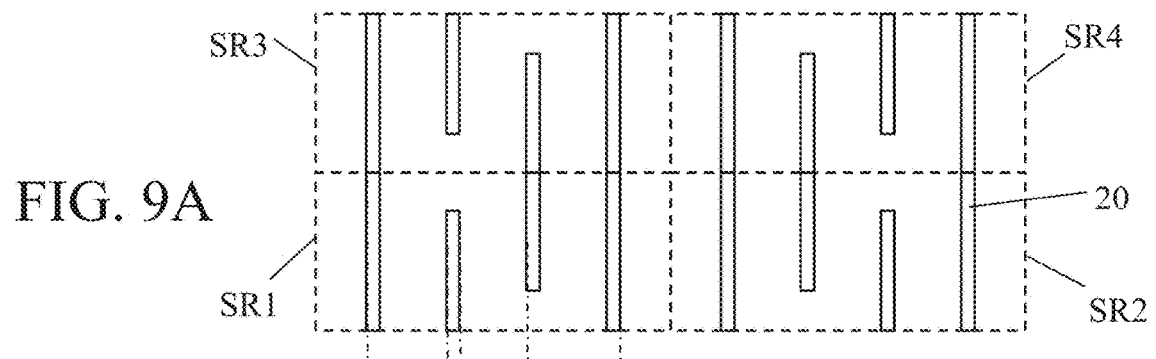
FIG. 9A
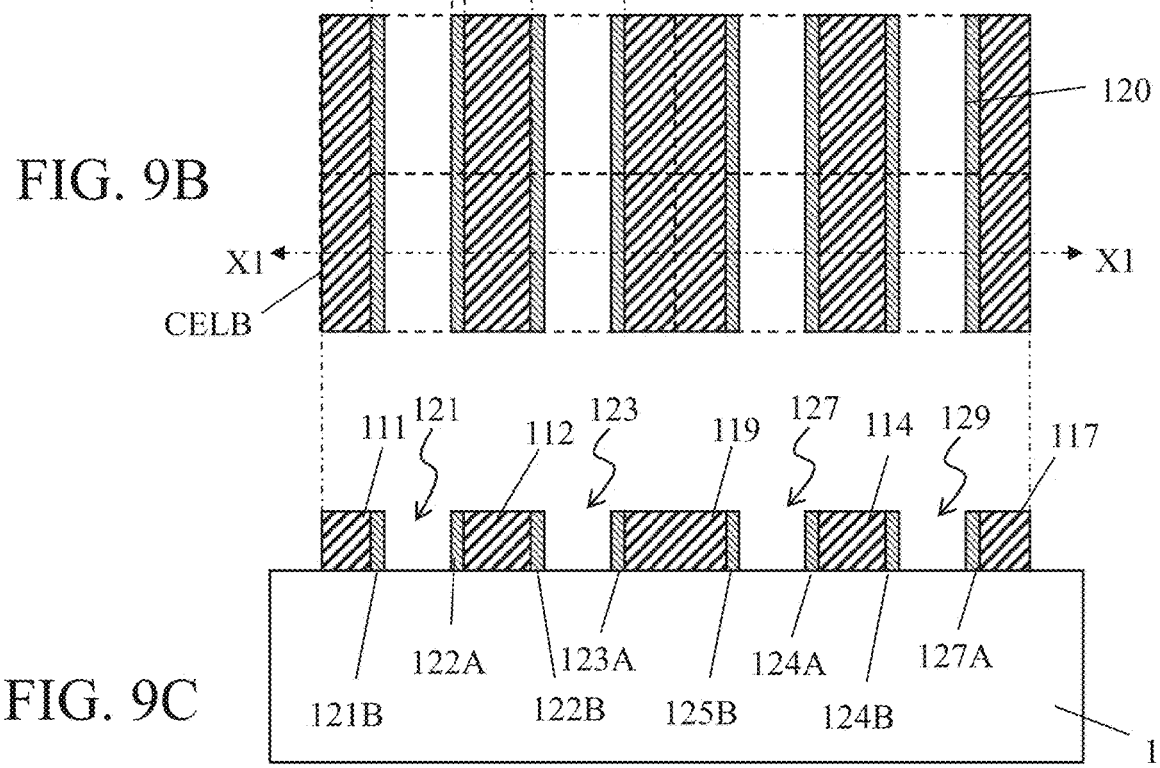
FIG. 9B
FIG. 9C

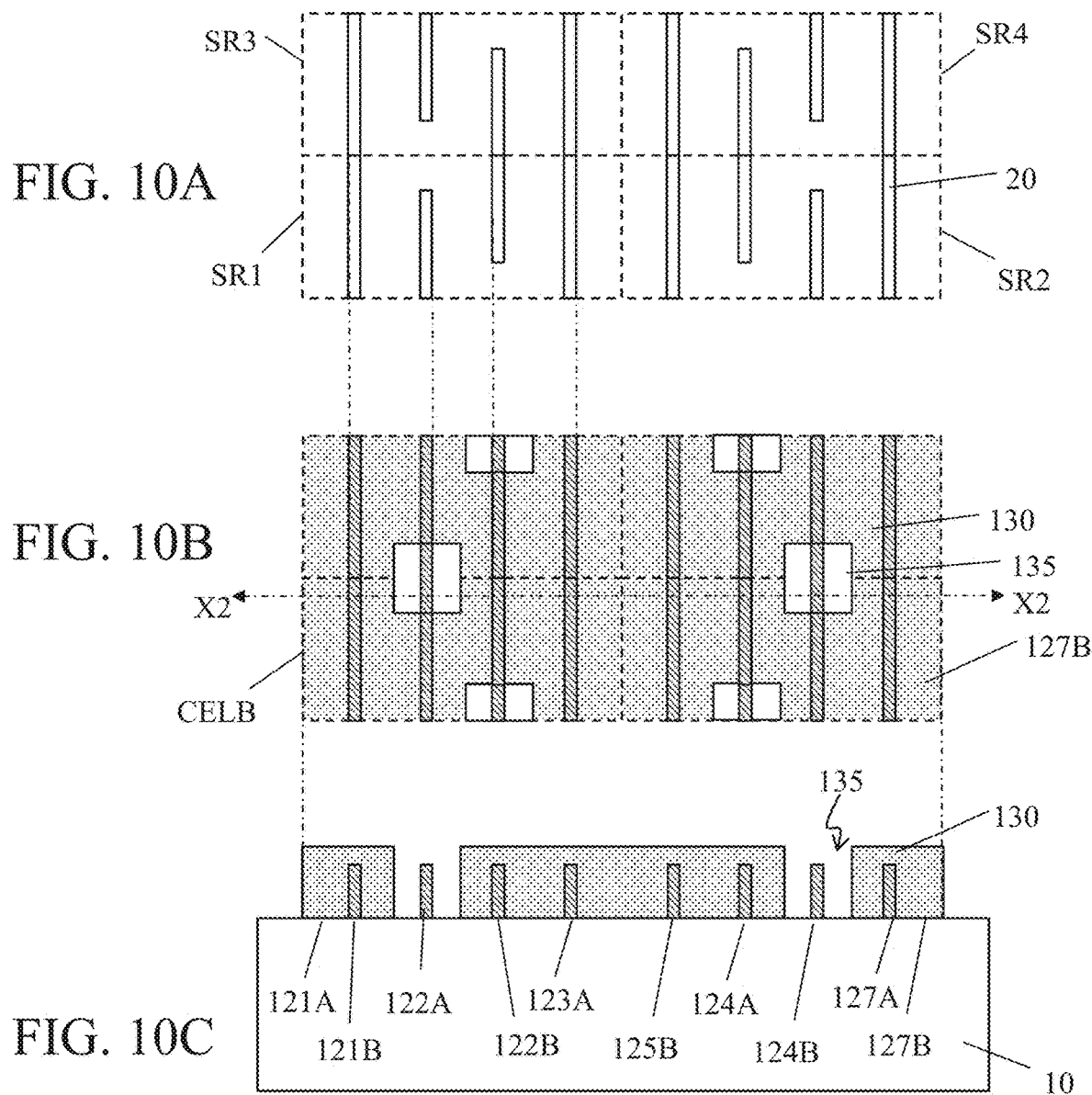

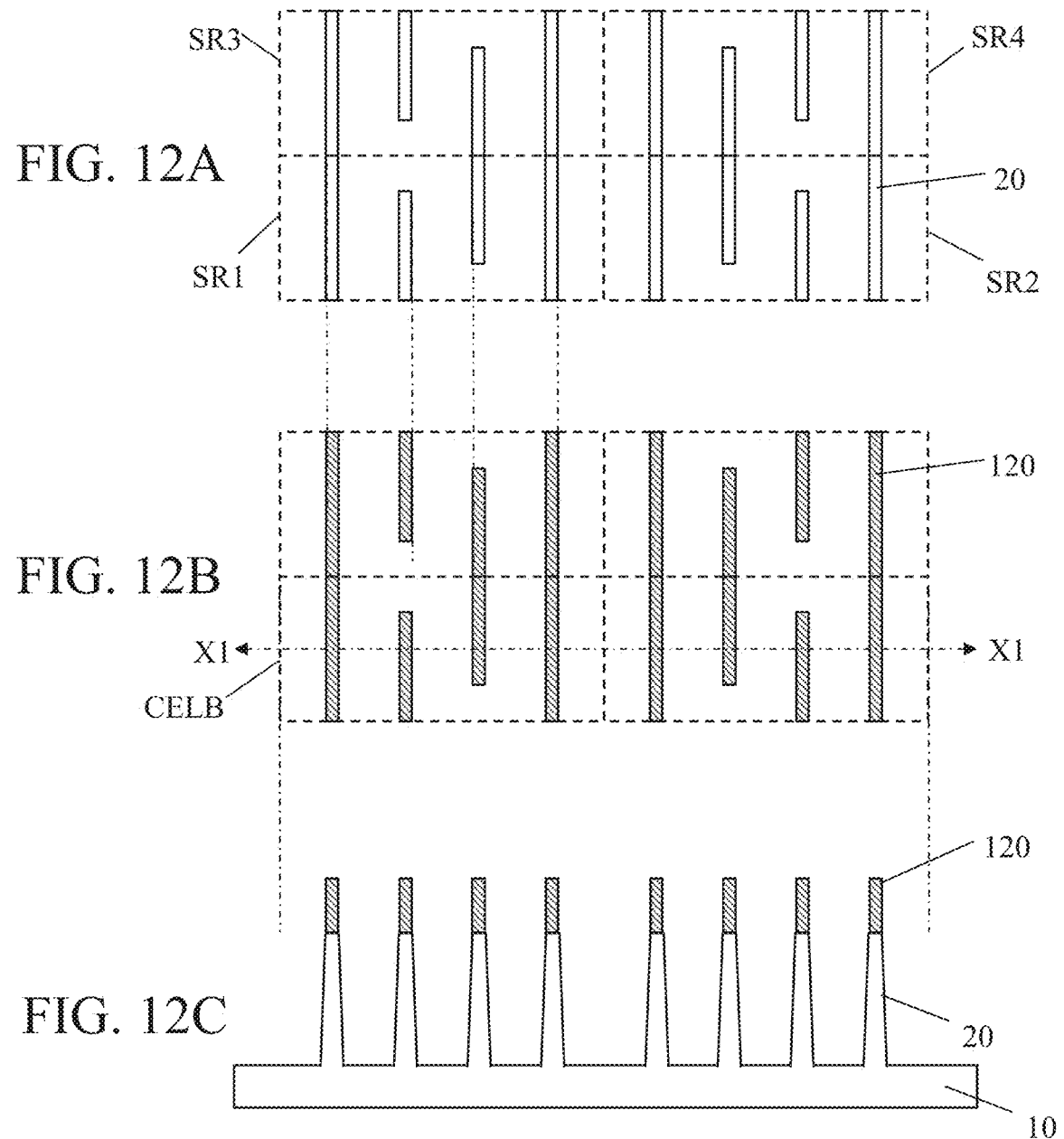

METHOD FOR MANUFACTURING STATIC RANDOM ACCESS MEMORY DEVICE

CROSS-REFERENCE TO RELATED APPLICATIONS

This application is a continuation of U.S. patent application Ser. No. 15/811,426, filed on Nov. 13, 2017, now U.S. Pat. No. 10,763,266, which is a continuation of U.S. patent application Ser. No. 14/958,592, filed on Dec. 3, 2015, now U.S. Pat. No. 9,842,843, the entire disclosures of each of which are incorporated herein by reference.

TECHNICAL FIELD

The disclosure relates to a semiconductor device, and more particularly to a method for manufacturing an SRAM (Static Random Access Memory) device having fin field effect transistor (Fin FET) devices.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (Fin FET). In a Fin FET device, it is possible to utilize additional sidewalls and to suppress a short channel effect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8A-12C show exemplary sequential processes for manufacturing fin structures for an SRAM device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Further, the layout structures shown in the present disclosure are design layouts and do not necessarily show exact physical structures fabricated as a semiconductor device.

Figure 1:
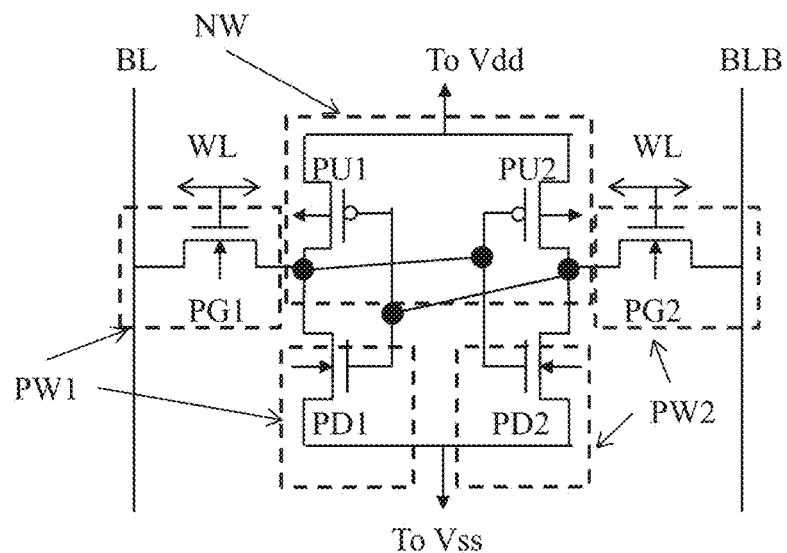
FIG. 1 is an exemplary circuit diagram of an SRAM unit cell.

FIG. 1 is an exemplary circuit diagram of an SRAM unit cell. An SRAM unit cell includes two cross-coupled inverters having a data storage node and a complementary data storage node. The output of the first inverter is coupled to the input of the second inverter, and the output of the second inverter is coupled to the input of the first inverter. The SRAM further includes a first pass-gate FET device PG1 coupled to the output of the first inverter and the input of the second inverter and a second pass-gate FET device PG2 coupled to the output of the second inverter and the input of the first inverter. Gates of the first and second pass-gate FET devices are coupled to a word line WL, a source/drain of the first pass-gate FET device PG1 is coupled to a first bit line BL, and a source/drain of the second pass-gate FET device PG2 is coupled to a second bit line BLB, which is the complement of the first bit line BL. In the present disclosure, a source and a drain of an FET device may be interchangeably used.

The first inverter includes a first first-conductive-type FET device PU1 and a first second-conductive-type FET device PD1. The second inverter includes a second first-conductive-type FET device PU2 and a second second-conductive-type FET device PD2. The first pass-gate device PG1 and the second pass-gate device PG2 are second-conductive type devices. In the embodiment, the first conductive type is a P-type and the second conductive type is an N-type. Of course, it is possible in another embodiment that the first conductive type is an N-type and the second conductive type is a P-type, and in such a case the remaining elements in the SRAM are appropriately modified according to the common knowledge in the art.

The SRAM further includes a first P-type well PW1, a second P-type well PW2 and an N-type well NW. As shown in FIG. 1, the first pass-gate device PG1 (N-type) and the first N-type FET device PD1 are disposed within the first P-type well PW1, the second pass-gate FET device PG2

(N-type) and the second N-type FET device PD2 are disposed within the second P-type well PW2, and the first P-type FET device PU1 and the second P-type FET device PU2 are disposed within the N-type well NW.

Figure 2:
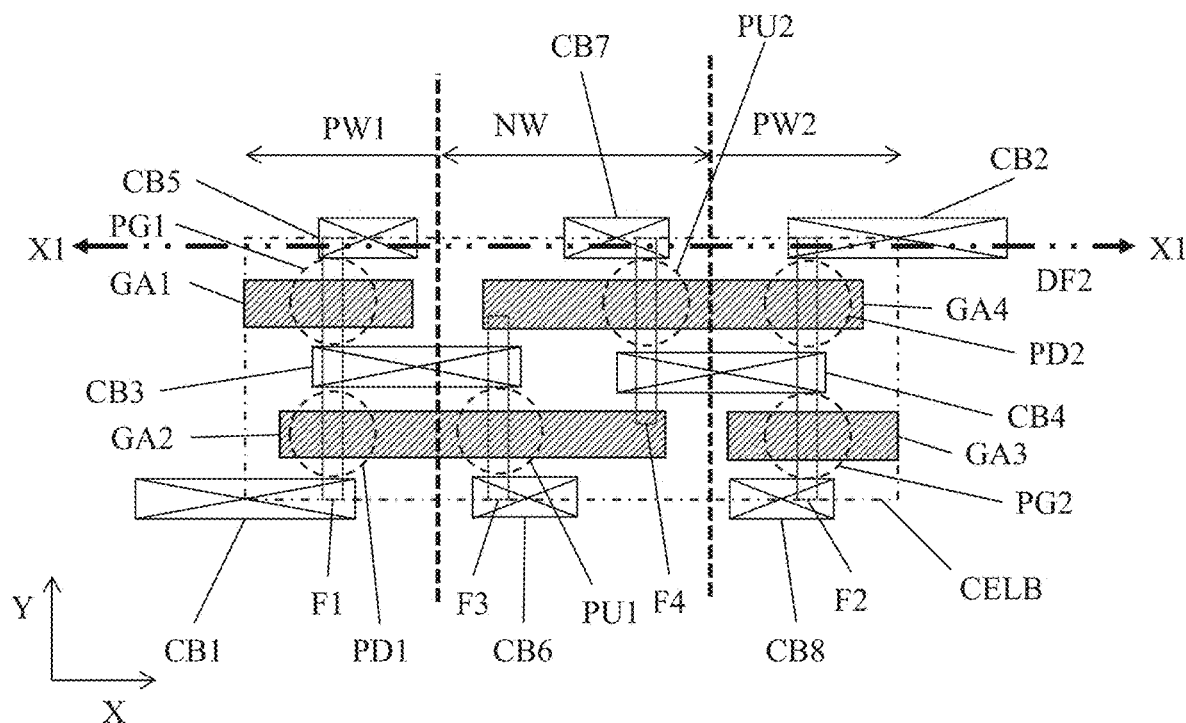
FIG. 2 is an exemplary layout of an SRAM unit cell according to one embodiment of the present disclosure.

FIG. 2 is an exemplary layout of an SRAM unit cell according to one embodiment of the present disclosure. In FIG. 2, only some of lower-layer elements are illustrated.

The SRAM unit cell is defined by a cell boundary CELB, and includes first to fourth fin structures F1, F2, F3 and F4, each extending in the Y (column) direction and arranged in the X (row) direction. The four fin structures F1, F3, F4 and F2 are arranged in the X direction in this order. The cell boundary CELB has a bottom side extending in the X direction, a top side extending in the X direction and opposing to the bottom side, a left side extending in the Y direction and a right side extending in the Y direction and opposing to the left side.

The SRAM unit cell includes six transistors. The first pass-gate device PG1 is a fin field effect transistor (Fin FET) (PG1) formed by a first gate electrode GA1 and the first fin structure F1. The first N-type FET device PD1 is a Fin FET formed by a second gate electrode GA2 and the first fin structure F1. The first P-type FET device PU1 is a Fin FET formed by the second gate electrode GA2 and the third fin structure F3. The second pass-gate FET device PG2 is a Fin FET formed by a third gate electrode GA3 and the second fin structure F2. The second N-type FET device PD2 is a Fin FET formed by a fourth gate electrode GA4 and the second fin structure F2. The second P-type FET device PU2 is a Fin FET formed by the fourth gate electrode GA4 and the fourth fin structure F4. Each of the six Fin FETs in the SRAM unit cell includes only one active fin structure functioning as a channel and source/drain.

The SRAM unit cell of the embodiment further includes a first contact bar CB1 that is formed over the source of the Fin FET PD1 including a source/drain (S/D) epitaxial layer formed over the first fin structure, and a second contact bar CB2 that is formed over the source of the Fin FET PD2 including an S/D epitaxial layer formed over the second fin structure. The first and second contact bars CB1 and CB2 are electrically connected to a first power supply line, for example, Vss. The S/D epitaxial layer is made of one or more layers of SiP, SiC, SiCP, Si, Ge, or a Group III-V material. The contact bars may be made of one or more layer of Cu, W, Al, AlCu, TiN, TiW, Ti, Co, Ni, TaN, Ta, or other refractory metal, or combinations thereof.

As shown in FIG. 2, the first and second fin structures F1 and F2 extend in the Y direction from a bottom side of the cell boundary CELB and a top side of the cell boundary CELB opposite to the bottom side. The third fin structure F3 extends in the Y direction from the bottom side of the cell boundary CELB and is shorter than the first and second fin structures. The fourth fin structure F4 extends in the Y direction from the top side of the cell boundary CELB and is shorter than the first and second fin structures.

The SRAM unit cell further includes third to eighth contact bars (contact plugs) CB3-CB8. The third contact bar CB3 connects a drain of the FinFET PG1 and a drain of the Fin FET PD1 to a drain of the Fin FET PU1, and electrically connected to the word line. The fourth contact bar CB4 connects a drain of the FinFET PG2 and a drain of the Fin FET PD2 to a drain of the Fin FET PU2, and electrically connected to the word line. The fifth contact bar CB5 is disposed over a source of the Fin FET PG1, and electrically connected to a bit line. The sixth contact bar CB6 is disposed over a source of the Fin FET PU1, and electrically connected to a second power supply line, for example, Vdd. The seventh contact bar CB7 is disposed over a source of the Fin FET PU2, and electrically connected to the second power supply line. The eighth contact bar CB8 is disposed over a source of the Fin FET PG2, and electrically connected to a complementary bit line.

Figure 3:
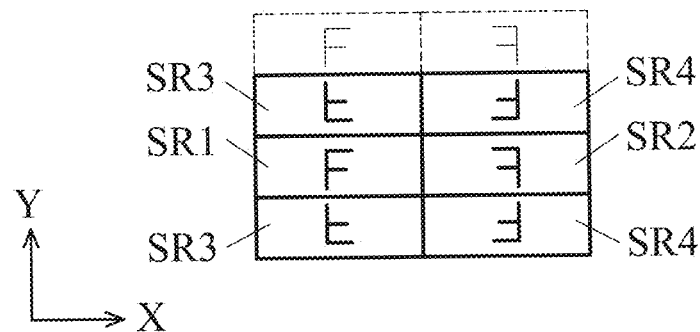
FIG. 3 is an exemplary arrangement of plural SRAM unit cells.

The SRAM includes a plurality of SRAM unit cells arranged in the X (row) and Y (column) directions. FIG. 3 shows an exemplary layout of four SRAM unit cells, first to fourth SRAM unit cells, SR1, SR2, SR3 and SR4. The first SRAM SR1 has, for example, the layout structures shown by FIG. 2. The second SRAM SR2 has a layout which is a horizontally flipped layout of the first SRAM SR1 with respect to an axis parallel to the Y direction. The third SRAM SR3 has a layout which is a vertically flipped layout of the first SRAM SR1 with respect to an axis parallel to the X direction. The fourth SRAM SR4 has a layout which is a horizontally flipped layout of the third SRAM SR3 with respect to an axis parallel to the Y direction. Along the column direction (Y), plural first SRAMs SR1 and plural third SRAMs SR3 are alternatively arranged.

Figure 4:
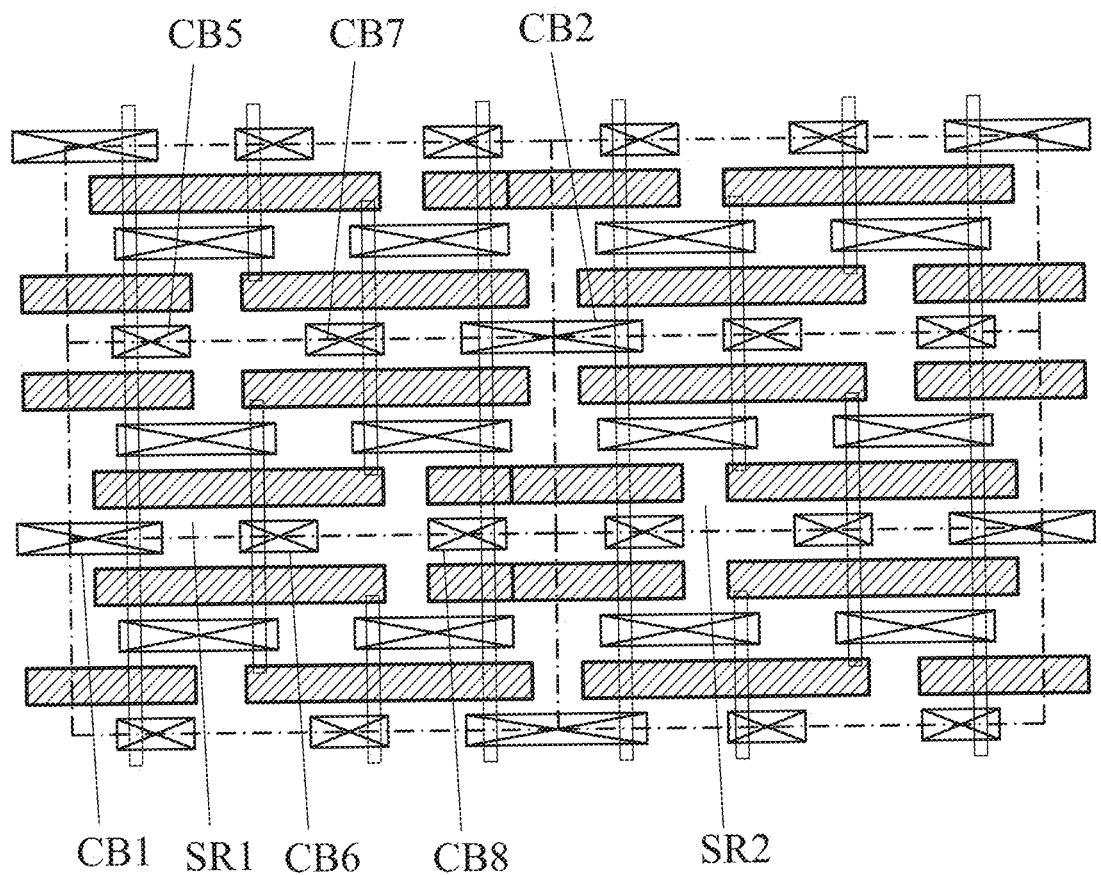
FIG. 4 is an exemplary arrangement of plural SRAM unit cells according to one embodiment of the present disclosure.

FIG. 4 shows an SRAM array showing 3 rows and 2 columns. Each SRAM unit cell has the layout structure of FIG. 2 and its flipped structures as set forth above.

As shown in FIG. 4, the first contact bar CB1 is located on a first side (left side) of the cell boundary CELB of one SRAM unit cell (e.g., SR1) and electrically connects the source of the Fin FET PD1 in the SRAM unit cell and the sources of the Fin FETs PD1 in the adjacent SRAM unit cells (e.g. SR2-SR4). The second contact bar CB2 is located on a right side and an upper side of the cell boundary CELB of one SRAM unit cell (e.g., SR1) and electrically connects the source of the Fin FET PD2 in the SRAM unit cell and the sources of the Fin FETs PD2 in the adjacent SRAM unit cells (e.g., SR2-SR4). The first and second contact bars CB1, CB2 are shared by the adjacent four SRAM unit cells.

The fifth contact bar CB5 is located on the upper side of the cell boundary in one SRAM unit cell (e.g., SR1) and connects the source of the Fin FET PG2 in the SRAM unit cell and the source of the Fin FET PG2 in the adjacent SRAM unit cell in the Y direction. The sixth contact bar CB6 is located on the lower side of the cell boundary in one SRAM unit cell (e.g., SR1) and connects the source of the Fin FET PU1 in the SRAM unit cell and the source of the Fin FET PU1 in the adjacent SRAM unit cell in the Y direction. The seventh contact bar CB7 is located on the upper side of the cell boundary in one SRAM unit cell (e.g., SR1) and connects the source of the Fin FET PU2 in the SRAM unit cell and the source of the Fin FET PU2 in the adjacent SRAM unit cell in the Y direction. The eighth contact bar CB8 is located on the lower side of the cell boundary in one SRAM unit cell (e.g., SR1) and connects the source of the Fin FET PG2 and the source of the Fin FET PG2 in the adjacent SRAM unit cell in the Y direction.

In the alternative, it can be said that the first and second contact bars CB1 and CB2 are disposed at corners where four adjacent SRAM unit cells SR1-SR4 gather, and are shared by four SRAM unit cells, and the fifth to eighth contact bars CB5-CB8 are shared by adjacent SRAM unit cells in the Y direction.

Figure 5A:
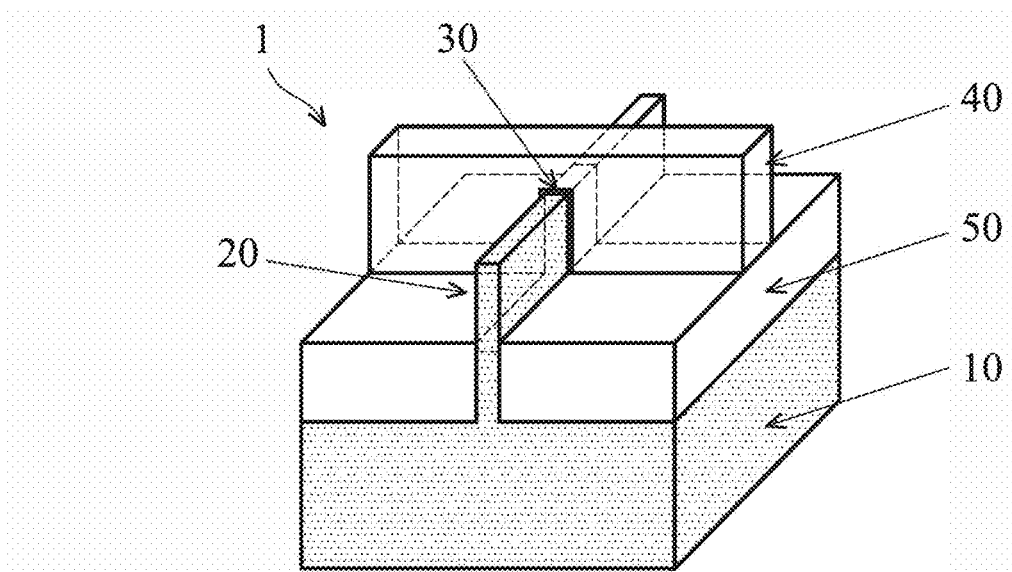
FIG. 5A shows an exemplary perspective view of a fin field effect transistor.

FIG. 5A shows an exemplary perspective view of a Fin FET. The Fin FET 1 include, among other features, a substrate 10, a fin structure 20, a gate dielectric 30 and a gate electrode 40. In this embodiment, the substrate 10 is a silicon substrate. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. The fin structure 20 is disposed over the substrate. The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

The lower part of the fin structure 20 under the gate electrode 40 is referred to as a well region, and the upper part of the fin structure 20 is referred to as a channel region. Under the gate electrode 40, the well region is embedded in the isolation insulating layer 50, and the channel region protrudes from the isolation insulating layer 50. Spaces between the fin structures 20 and/or a space between one fin structure and another element formed over the substrate 10 are filled by an isolation insulating layer 50 (or so-called a "shallow-trench-isolation (STI)" layer) including an insulating material. The insulating material for the isolation insulating layer 50 may include silicon oxide, silicon nitride, silicon oxynitride (SiON), SiOCN, fluorine-doped silicate glass (FSG), or a low-k dielectric material.

The channel region protruding from the isolation insulating layer 50 is covered by a gate dielectric layer 30, and the gate dielectric layer 30 is further covered by a gate electrode 40. Part of the channel region not covered by the gate electrode 40 functions as a source and/or drain of the MOS FET.

In certain embodiments, the gate dielectric layer 30 includes a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode 40 includes any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In some embodiments, one or more work function adjustment layers (not shown) may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of two or more of these materials. For the n-channel Fin FET, one or more of TaN, TaAlC, TiN, TiC, Co, TiAl, HfTi, TiSi and TaSi, or any other suitable materials, is used as the work function adjustment layer, and for the p-channel Fin FET, one or more of TiAlC, Al, TiAl, TaN, TaAlC, TiN, TiC and Co, or any other suitable materials, is used as the work function adjustment layer. The work function adjustment layer may be formed separately for the n-channel Fin FET and the p-channel Fin FET which may use different metal layers.

Source and drain regions are also formed in the fin structure 20 not covered by the gate electrode 40, by appropriately doping impurities in the source and drain regions or epitaxially growing appropriate material. An alloy of Si or Ge and a metal such as Co, Ni, W, Ti or Ta may be formed on the source and drain regions.

Figure 5B:
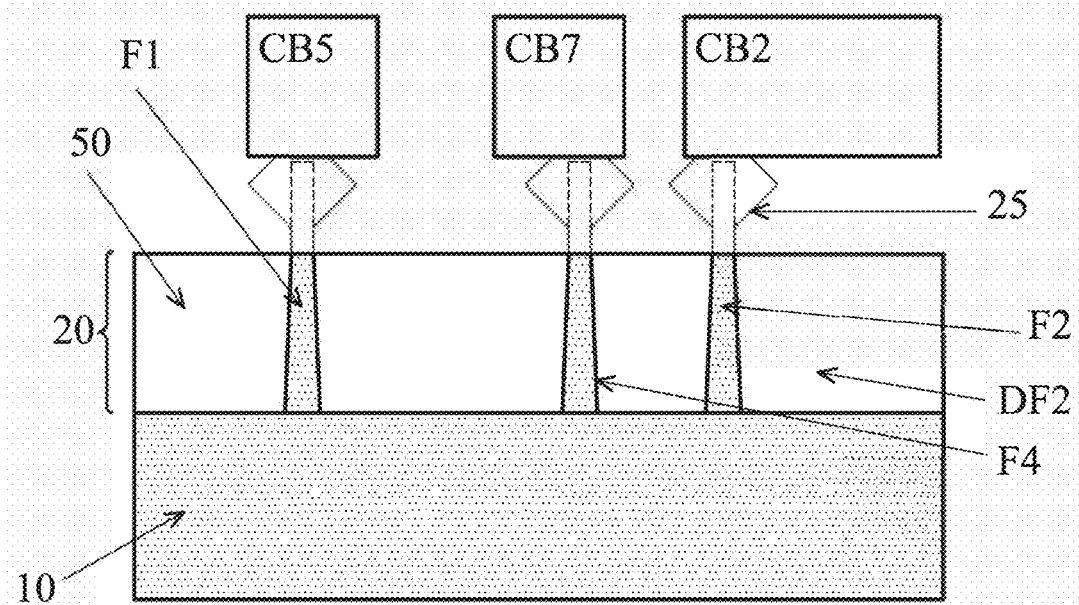
FIG. 5B shows an exemplary cross sectional view along line X1-X1 of FIG. 2.

FIG. 5B shows an exemplary cross sectional view along line X1-X1 of FIG. 2. An epitaxial S/D layer 25 is formed on each of the fin structures F1, F4 and F2. Further, the second contact bar CB2 is formed on the S/D layers of the second fin structure F2. The fifth and seventh contact bars CB5 and CB7 are formed on the first fin structure F1 and the fourth fin structure F4, respectively.

Figure 5C:
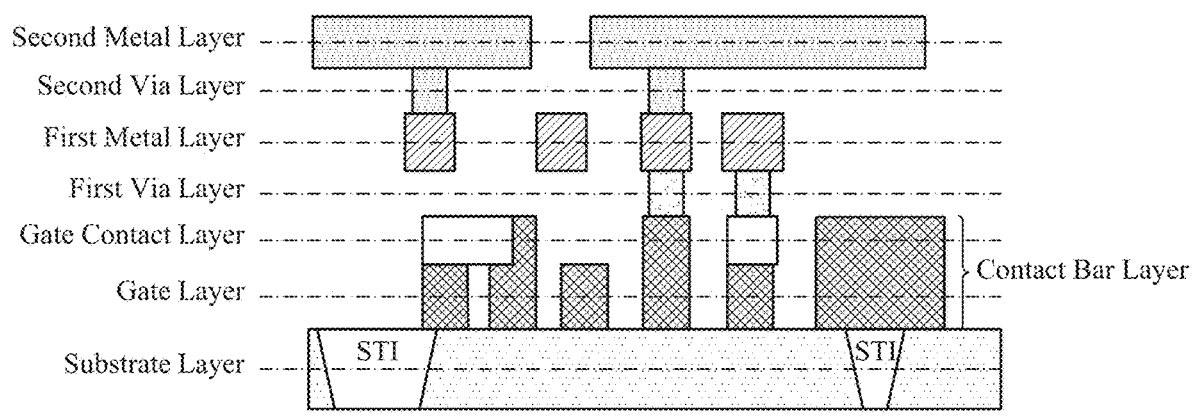
FIG. 5C is an exemplary cross sectional view illustrating vertical layers.

FIG. 5C shows an exemplary cross sectional view illustrating a vertical layer arrangement of the SRAM. FIG. 5C does not necessarily show a specific cross section of the SRAM unit cell described with FIGS. 2-4.

In the substrate layer the fin structures and source/drain structures are disposed. In the gate layer, gate structures including gate electrodes and gate dielectric layers are disposed. The gate contact layer is located above the gate layer. The contact bars are located in the contact bar layer extending from the gate layer to the gate contact layer. In the first via layer located over the gate contact layer and the contact bar layer, first vias are disposed. In the first metal layer, the first metal wirings are disposed. In the second via layer, the second vias are disposed. In the second metal layer level, second metal wirings are is disposed.

Figure 6:
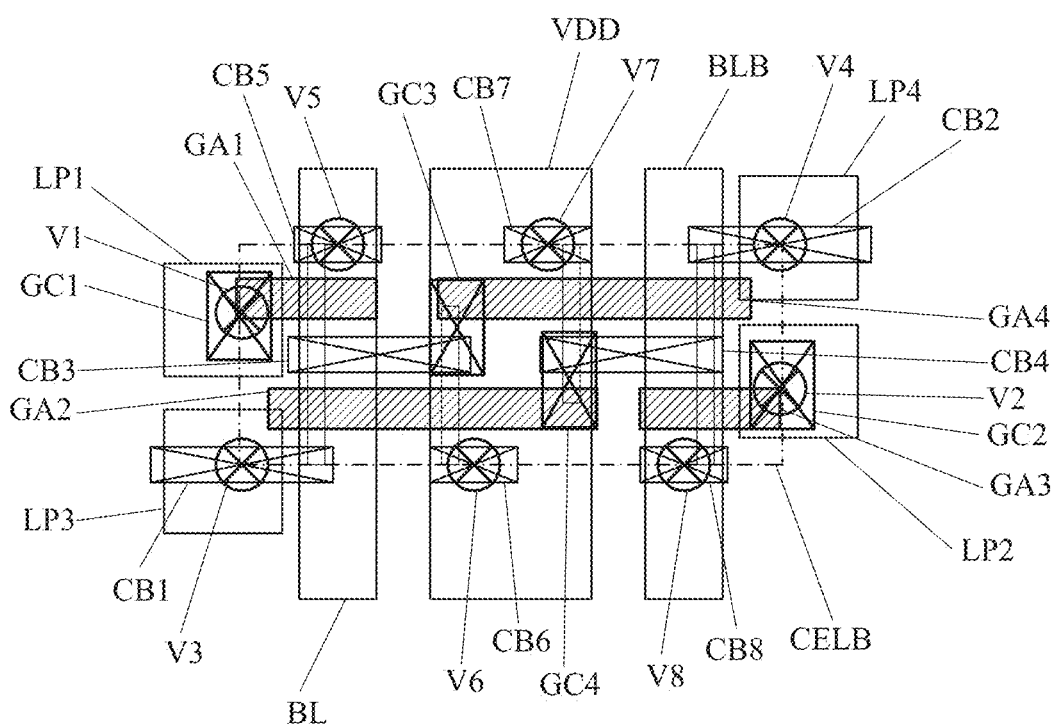
FIGS. 6 and 7 are exemplary layouts of an SRAM unit cell according to one embodiment of the present disclosure.
Figure 7:
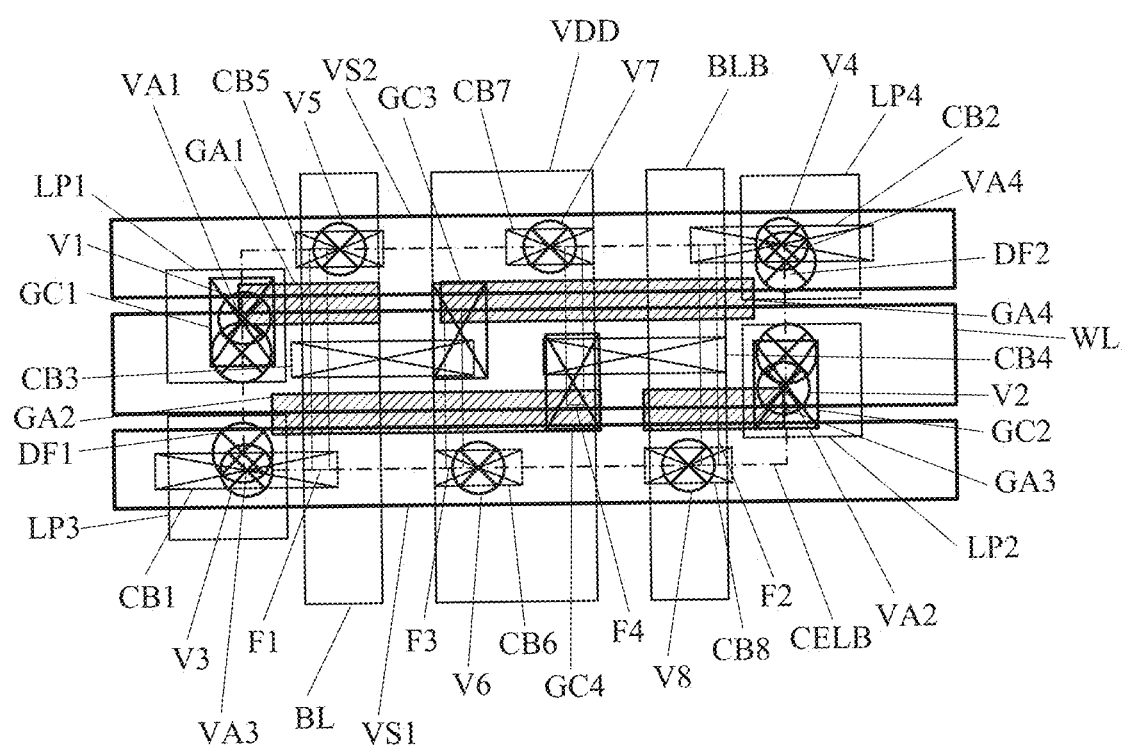

FIGS. 6 and 7 show an exemplary upper-layer layout of an SRAM unit cell according to the embodiment of the present disclosure.

As shown in FIG. 6, the SRAM unit cell further includes first to fourth gate contacts GC1-GC4. The first gate contact GC1 is disposed on the first gate electrode GA1, and a second gate contact GC2 is disposed on the third gate electrode GA3. The third gate contact GC3 is disposed over the fourth gate electrode GA4 and the third contact bar CB3 and electrically connects the fourth gate electrode GC4 and the third contact bar CB3. The fourth gate contact GC4 is disposed over the third gate electrode GA3 and the fourth contact bar CB4 and electrically connects the third gate electrode GA3 and the fourth contact bar CB4. As shown in FIG. 6, the first and second gate contacts GC1 and GC2 are located on the cell boundary CELB and shared by adjacent SRAM unit cells.

The SRAM unit cell further includes first to eighth vias V1-V8. The first via V1 is disposed over the first gate contact GC1, and the second via V2 is disposed over the second gate contact GC2. The third via V3 is disposed over the first contact bar CB1, and the fourth via V4 is disposed over the second contact bar CB2. The fifth via V5 is disposed over the fifth contact bar CB5, the sixth via V6 is disposed over the sixth contact bar CB6, the seventh via V7 is disposed over the seventh contact bar CB7, and the eighth via V8 is disposed over the eighth contact bar CB8. As shown in FIG. 6, the vias V1-V8 are located on the cell boundary CELB and shared by adjacent SRAM unit cells. The vias V1-V8 are formed in the first via layer shown in FIG. 5C.

FIG. 6 also shows the bit line BL, the second power supply line VDD and the complementary bit line BLB, which extend in the Y direction over plural SRAM unit cells. The bit line BL is electrically connected to the source of the Fin FET PG1 (formed on the first fin structure F1) through the fifth via V5 and the fifth contact bar CB5, and the complementary bit line BLB is electrically connected to the source of the Fin FET PG2 (formed on the second fin structure F2) through the eighth via V8 and the eighth contact bar CB8. The second power supply line VDD is electrically connected to the source of the Fin FET PU1 (formed on the third fin structure F3) and the source of the Fin FET PU2 (formed on the fourth fin structure F4) through the sixth and seventh vias V6 and V7 and the sixth and seventh contact bars CB6 and CB7, respectively.

In addition, first to fourth local plates LP1-LP4 are provided. The first local plate LP1 is electrically connected to the first gate electrode through the first via V1 and the first gate contact GC1, and the second local plate LP2 is electrically connected to the third gate electrode GC3 through the second via V2 and the second gate contact GC2. The third local plate LP3 is electrically connected to the source of the Fin FET PD1 through the third via V3 and the first contact bar CB1, and the fourth local plate LP4 is electrically connected to the source of the Fin FET PD2 through the fourth via V4 and the second contact bar CB2. The bit line BL, the complementary bit line BLB, the second power supply line VDD and the first to fourth local plates are formed in the first metal layer shown in FIG. 5C.

FIG. 7 shows an exemplary upper-layer layout of an SRAM unit cell. A word line WL extending in the X direction is provided and is electrically connected to the first and second local plates LP1 and LP2 through a first upper via VA1 and a second upper via VA2. Two first power supply lines VS1 and VS2 extending in the X direction are also provided, and are connected to the third fourth local plates LP3 and LP4 through a third upper via VA3 and a fourth upper via VA4, respectively.

As shown in FIG. 7, the first and second upper vias VA1 and VA2 are located on the cell boundary CELB and shared by adjacent SRAM unit cells, and the third and fourth upper vias VA3 and VA4 are located at the corner of the cell boundary CELB, and are shared by four adjacent SRAM unit cells. The upper vias VA1-VA4 are formed in the second via layer and the word lines WL and the first power supply lines VS1 and VS2 are formed in the second metal layer, as shown in FIG. 5C.

The vias and metal layers are made of one or more layers of Cu, W, Al, AlCu, TiN, TiW, Ti, Co, Ni, TaN, Ta, or other refractory metal, or combinations thereof.

FIGS. 8A-12C show exemplary sequential processes for manufacturing fin structures for an SRAM device according to one embodiment of the present disclosure. FIGS. 8A, 9A, . . . 12A are all the same figure illustrating the fin structure layout in four adjacent SRAM unit cells subsequently formed. FIGS. 8B, 9B, . . . 12B show plan views in each manufacturing stage and FIGS. 8C, 9C, . . . 12C show cross sectional views along X1-X1 or X2-X2 in FIGS. 8B, 9B, . . . 12B in each manufacturing stage. It is understood that additional operations may be provided before, during, and after processes shown by FIGS. 8A-12C, and some of the operations described below can be replaced or eliminated in additional embodiments of the method.

FIG. 8A shows the fin structure layout in four adjacent SRAM unit cells subsequently formed. The layout of the four SRAM unit cells is the same as FIG. 4.

In one SRAM unit cell, for example, SR1, four fin structures 22, 24, 26 and 28, which correspond to first to fourth fin structures of FIG. 2, respectively, are provided. The fin structures extend in the second direction (Y direction) and arranged in the first direction (X direction).

Within one cell, i.e., within one cell boundary, the first fin structure 22 extends between a bottom side of the cell boundary and a top side of the cell boundary opposite to the bottom side. The second fin structure 24 extends between the bottom side of the cell boundary and the top side of the cell boundary opposite to the bottom side. The third fin structure 26 extends from the bottom side, and is shorter than the first fin structure. The fourth fin structure 28 extends from the top side, and is shorter than the second fin structure. The first to fourth fin structures are arranged in the X direction with a predetermined space. The predetermined space is constant in this embodiment. The space between the first and third fin structures may be different from the space between the third and fourth fin structures.

The width of the fin structures is in a range from about 5 nm to about 30 nm in some embodiments and is a range from about 7 nm to about 15 nm in other embodiments. The space Si between adjacent fin structures is in a range from about 20 nm to about 50 nm in some embodiments, and in a range from about 30 nm to about 40 nm in other embodiments.

As shown in FIGS. 8B and 8C, a first dummy pattern 110 is formed over a substrate 10. The first dummy pattern 110 is made of inorganic materials such as silicon oxide and/or silicon nitride. A blanket layer of a first material is formed over the substrate 10 and then a patterning operation including a lithography operation and/or an etching operation is performed to form the first dummy patterns 110.

When the first dummy pattern 110 is made of an inorganic material, chemical vapor deposition (CVD), physical vapor deposition (PVD) or atomic layer deposition (ALD) can be used to form the blanket layer.

The first dummy patterns 110 are formed in a line-and-pace shape extending in the Y direction. The width of the first dummy pattern 110 is substantially the same as space S2. As shown in FIGS. 8A and 8B, the left edge the first dummy pattern 110 substantially corresponds to the right edge of the third fin structure 26 and the right edge of the first dummy pattern 110 substantially corresponds to the left edge of the fourth fin structure 28. The first dummy patterns including dummy patterns 111, 112, 119, 114 and 117 extending in the Y direction are formed in this order in the X direction.

The thickness of the first dummy pattern 110 is in a range from about 100 nm to about 300 nm.

Then, a blanket layer 120 of a second material is formed over the first dummy patterns 110. The second material is an inorganic material such as silicon oxide and silicon nitride and is different from the first material. In this embodiment, silicon oxide formed by CVD is used. The thickness of the second material from the upper surface of the substrate 10 is in a range from about 5 nm to about 20 nm.

Since the thickness of the second material layer is sufficiently smaller than the spaces 121, 123, 127 and 129 of the first dummy patterns, the second material layer does not fully fill the spaces and is conformally formed over the first dummy patterns.

Next, anisotropic etching is performed on the blanket layer of the second material. As shown in FIGS. 9B and 9C, the second material remains as sidewall spacers on the left and right sides of the first dummy patterns, and after removing the first dummy patterns, mask patterns 121B, 122A, 123A, 125B, 124A, 124B and 127A are formed.

The width of each of the mask patterns 121B, 122A, 123A, 125B, 124A, 124B and 127A is substantially the same as or slightly larger than the width of the fin structures subsequently formed. The width is in a range from about 7 nm to about 20 nm.

By adjusting the thickness and/or dimensions of the blanket layers of first and second materials and the first dummy patterns, the desired width and locations of the mask pattern can be obtained.

Next, as shown in FIGS. 10B and 10C, resist pattern 130 having openings 135 is formed over the mask patterns. FIG. 10C is the cross sectional view along line X2-X2 of FIG. 10B. Part of the mask patterns 122A and 124B are exposed via the openings 135.

Figure 11A:
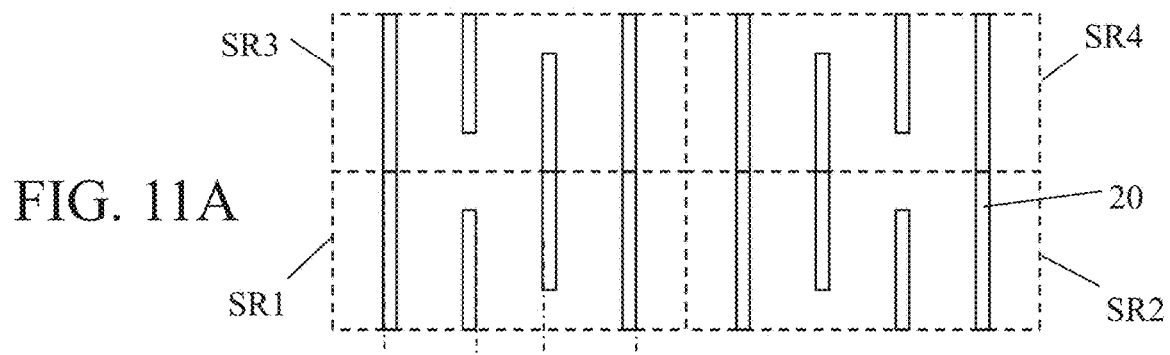
Figure 11B:
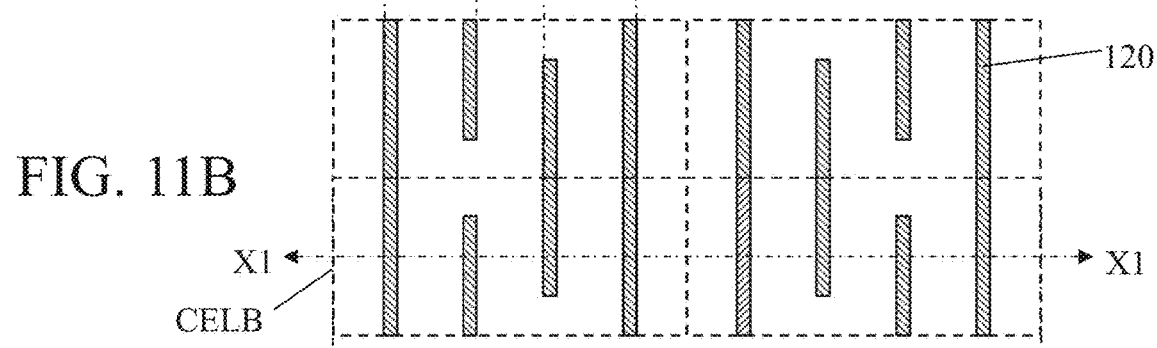
Figure 11C:
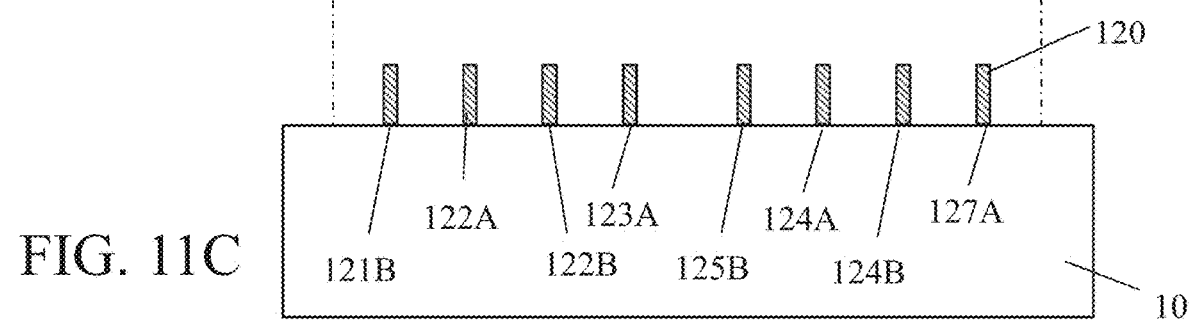

Then, the exposed portions of the mask patterns are removed by etching operations and the resist pattern 130 is removed. As shown in FIGS. 11B and 11C, the mask patterns 121B, 122A, 122B, 123A, 125B, 124A, 124B and 127A corresponding to the fin structures to be formed remain on the substrate 10. The space between adjacent mask patterns within the cell boundary is constant in this embodiment.

By using the mask patterns 121B, 122A, 122B, 123A, 125B, 124A, 124B and 127A as etching masks, trench etching is performed on the substrate 10, thereby forming fin structures 20, as shown in FIGS. 12B and 12C. The mask patterns are eventually removed.

Figure 13:
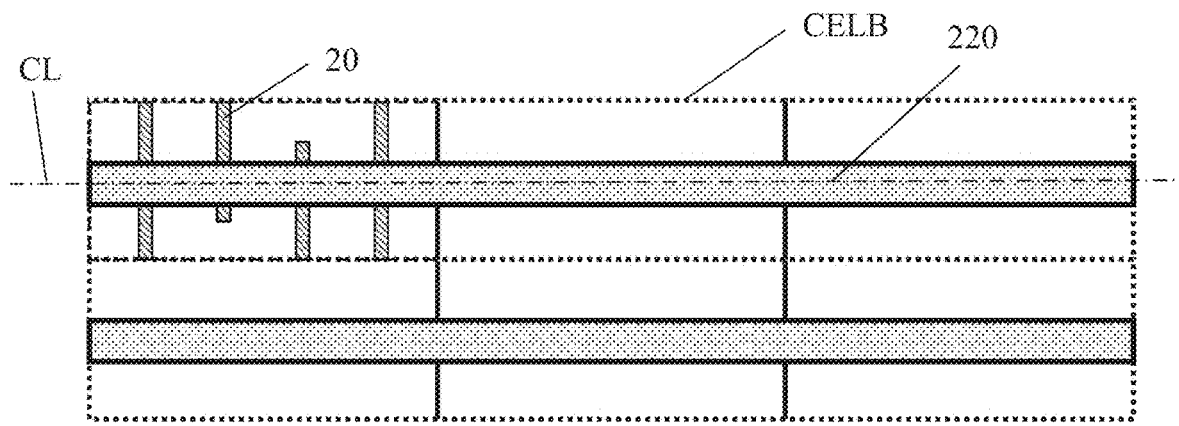
FIGS. 13-17B show exemplary sequential processes for manufacturing gate structures for an SRAM device according to one embodiment of the present disclosure.

FIGS. 13-17B show exemplary sequential processes for manufacturing gate structures for an SRAM device according to one embodiment of the present disclosure. In FIG. 13, the SRAM unit cells having a 2-rows and 3-columns arrangement is illustrated.

After the fin structures 20 are formed, an isolation insulating layer 200 (see, FIG. 14B) is formed over the substrate so that upper portions of the fin structures are exposed from the isolation insulating layer 200. Then, blanket layers for a gate dielectric layer (not shown) and a gate electrode layer 210 (see, FIG. 14B) are formed over the exposed fin structures and the isolation insulating layer 200.

Then, as shown in FIG. 13, second dummy patterns 220 are formed over the gate electrode layer 210. FIG. 13 is a top view (plan view) and underlying fin structures 20 are shown in one of the SRAM unit cell for the purpose of explaining relative locations of the fin structure and the gate structures.

A blanket layer of a third material is formed over the gate electrode layer and a patterning operation is performed to obtain the second dummy patterns 220 of the third material. The third material is one or more layers of silicon oxide and/or silicon nitride.

In the patterning operation, design data having one thin rectangular pattern extending in the X direction within one SRAM unit cell are prepared and a photo mask having opaque patterns corresponding to the thin rectangular pattern is prepared (when a positive photo resist is used). In the present embodiment, the thin rectangular pattern is disposed at the center line CL of the SRAM unit cell in the Y direction. In other words, on the photo mask (or the design data), only one pattern is included in one SRAM unit cell. By using this photo mask, resist patterns corresponding to the dummy patterns 220 are formed on the blanket layer of the third material, and the second dummy patterns 220 are obtained by a dry etching operation.

Figure 14A:
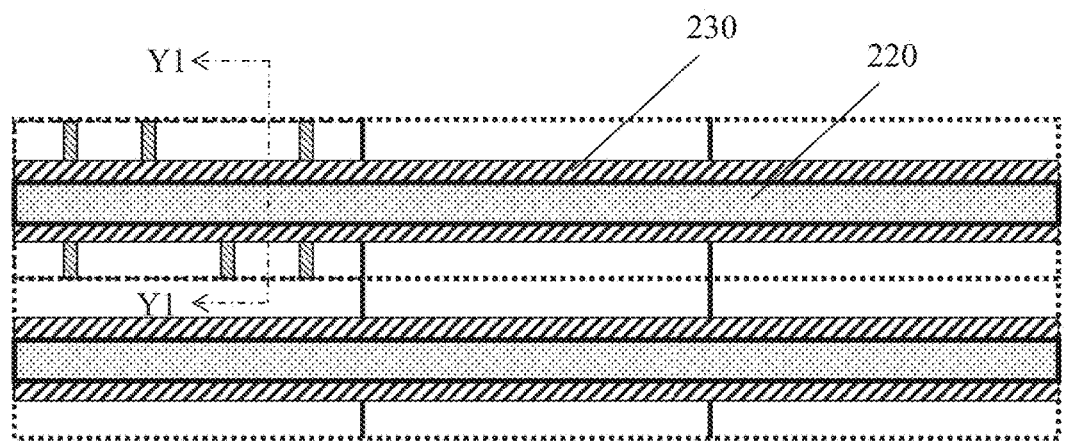
Figure 14B:
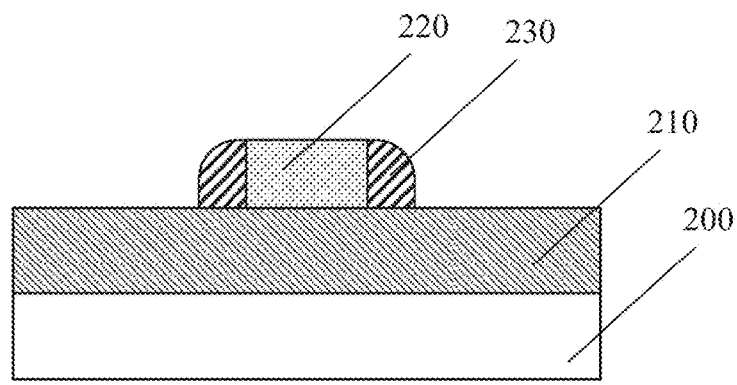

After the second dummy patterns 220 are formed, a blanket layer of a fourth material is formed over the second dummy patterns 220 and the gate electrode layer 210, and anisotropic etching is performed on the fourth material layer, thereby obtaining first hard mask layer 230 as sidewall spacer layers, as shown in FIGS. 14A and 14B. FIG. 14A is a top view and FIG. 14B is a cross sectional view along the lines Y1-Y1 of FIG. 14A.

Figure 15A:
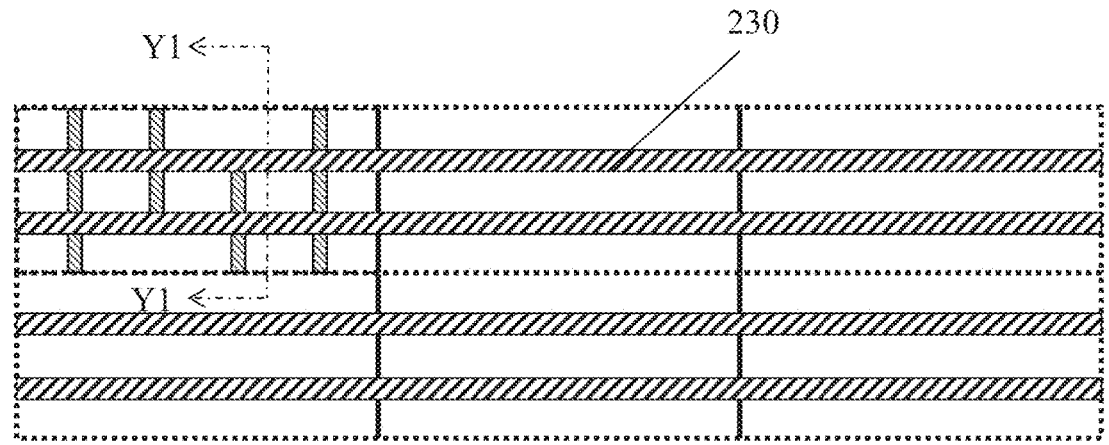
Figure 15B:
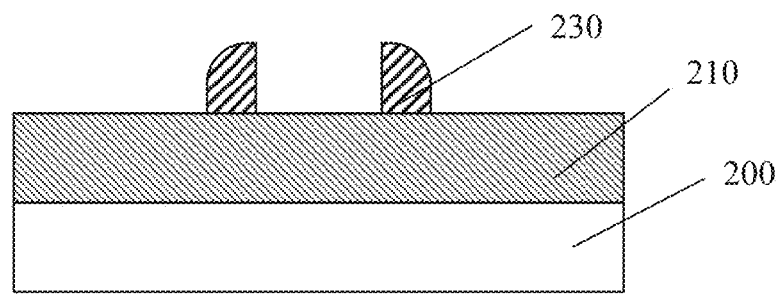

Then, as shown in FIGS. 15A and 15B, the second dummy patterns 220 are removed, thereby leaving the first hard mask patterns 230. FIG. 15A is a top view and FIG. 15B is a cross sectional view along the lines Y1-Y1 of FIG. 15A. The width of the first hard mask pattern 230 at the bottom thereof is in a range from about 5 nm to about 15 nm.

Figure 16:
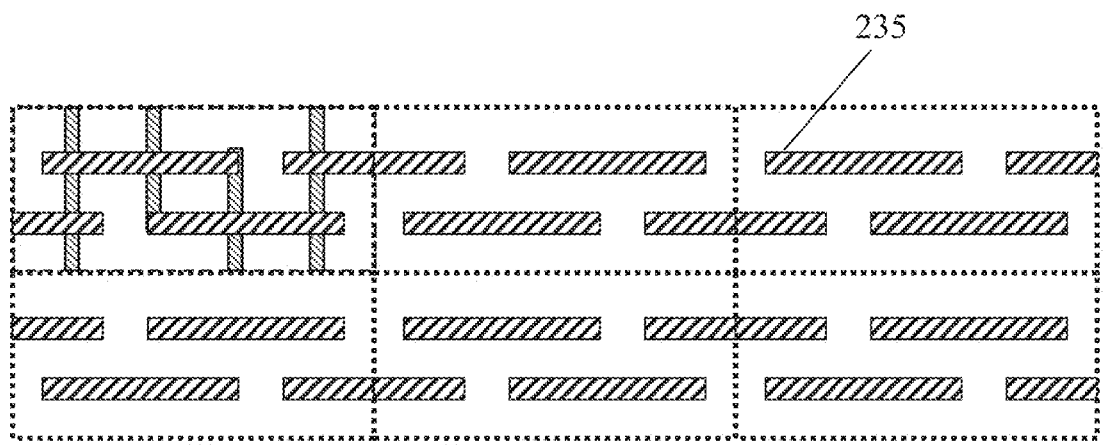

As shown in FIG. 16, a patterning operation is performed to "cut" or "divide" the first hard mask patterns into plural pieces of first hard mask patterns 235 so as to correspond to the desired gate electrode pattern.

Figure 17A:
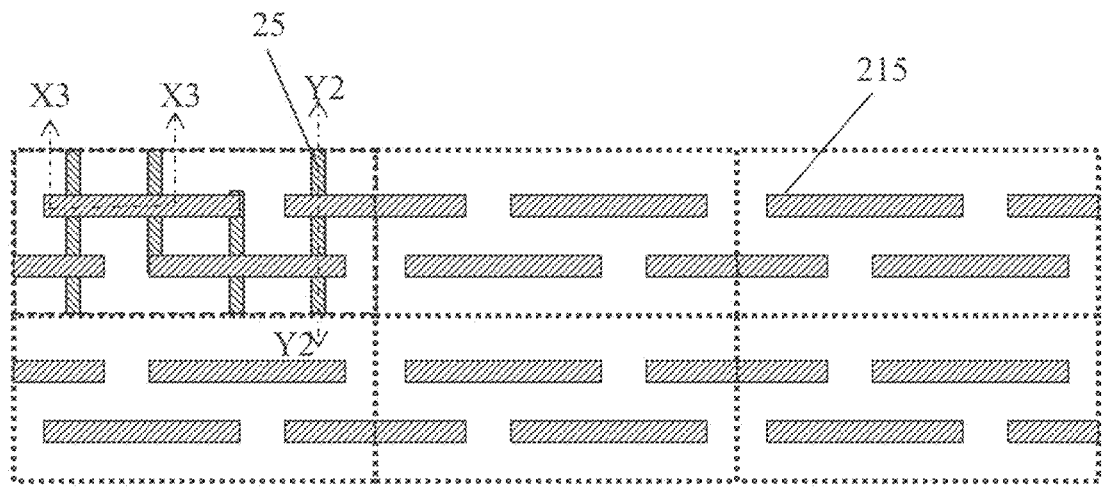
Figure 17B:
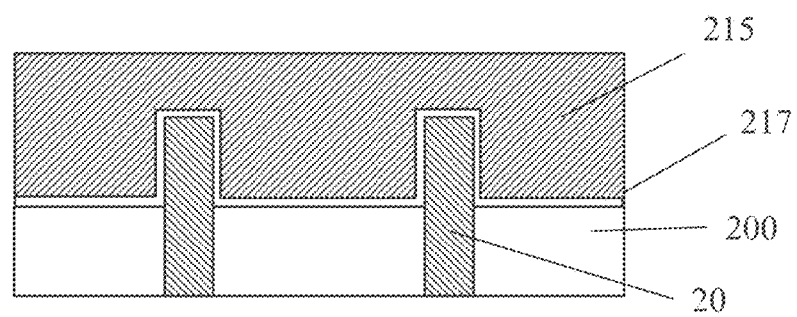

By using the "cut" first hard mask pattern 235, the gate electrode layer 210 is patterned by dry etching into gate electrode pattern 215, as shown in FIGS. 17A and 17B. FIG. 17A is a top view and FIG. 17B is a cross sectional view along the lines X3-X3 of FIG. 17A. As shown in FIG. 17B, the gate dielectric layer 217 is disposed over the exposed fin structures 20 and the gate electrode 215 is disposed over the gate dielectric layer 217.

If a gate replacement technology is used, the gate electrode 215 and the gate dielectric layer 217 are treated as dummy layers, which are subsequently replaced with an actual gate electrode and a gate dielectric layer.

After the gate electrodes 215 are formed, portions of the fin structures 20 not covered by the gate structure are recessed and source/drain (S/D) epitaxial layers 25 are formed in and above the recessed portions.

Figure 18:
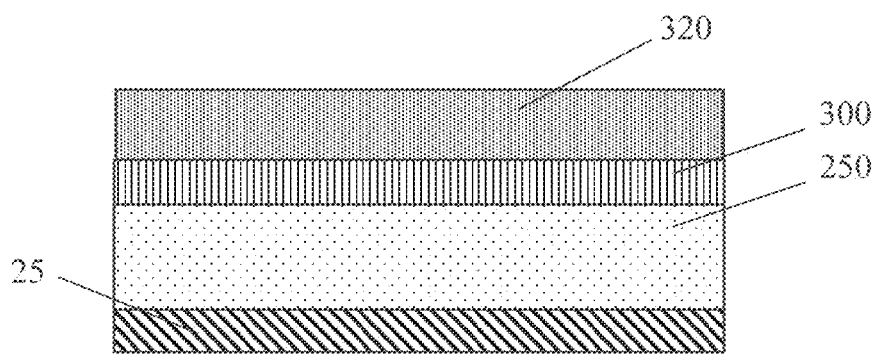
FIGS. 18-28B show exemplary sequential processes for manufacturing contact bar structures for an SRAM device according to one embodiment of the present disclosure.

FIGS. 18-28B show exemplary sequential processes for manufacturing contact bar structures for an SRAM device according to one embodiment of the present disclosure. In FIG. 18, the SRAM unit cells having a 2-rows and 3-columns arrangement is illustrated.

After the gate structures and the S/D epitaxial layers are formed, an interlayer dielectric layer (ILD) 250 is formed over the gate structures and the S/D epitaxial layer. FIG. 18 is a cross sectional view corresponding to the line Y2-Y2 of FIG. 17A. Further, a blanket layer 300 for a second hard mask layer is formed over the ILD layer 250, and furthermore, a blanket layer 320 for a third dummy pattern is formed over the layer 300. The thickness of the ILD layer 250 is in a range from about 20 nm to about 600 nm in some embodiments, and in a range from about 50 nm to about 300 nm in other embodiments.

The ILD layer 250 is made of, for example, one or more layers of low-k dielectric material. Low-k dielectric materials have a k-value (dielectric constant) lower than about 4.0. Some low-k dielectric materials have a k-value lower than about 3.5 and may have a k-value lower than about 2.5. The materials for the ILD layer 250 may include compounds comprising Si, O, C and/or H, such as SiCOH and SiOC. Organic material, such as polymers, may be used for the ILD layer 250. For example, the ILD layer 250 is made of one or more layers of a carbon-containing material, organo-silicate glass, a porogen-containing material, and/or combinations thereof in certain embodiments. The ILD layer 250 may be formed by using, for example, plasma-enhanced chemical vapor deposition (PECVD), low pressure CVD (LPCVD), atomic layer CVD (ALCVD), and/or a spin-on technology.

The layer 300 for the second hard mask layer includes one or more layers of dielectric materials or metal material, such as TiN, poly-Si, amorphous Si, silicon oxide or silicon nitride. The thickness of each layer of the layer 300 is in a range from about 2 nm to about 200 nm in some embodiments, and in a range from about 5 nm to about 50 nm in other embodiments.

The layer 330 for the third dummy layer includes one or more layers of dielectric materials or metal material, such as TiN, poly-Si, amorphous Si, silicon oxide or silicon nitride. The thickness of each layer of the layer 330 is in a range from about 2 nm to about 200 nm in some embodiments, and in a range from about 5 nm to about 50 nm in other embodiments.

The layers 300, 320 and 330 may be formed by using, for example, physical vapor deposition (PVD), sputtering, plasma-enhanced chemical vapor deposition (PECVD), low pressure CVD (LPCVD) and/or atomic layer CVD (ALCVD).

Figure 19:
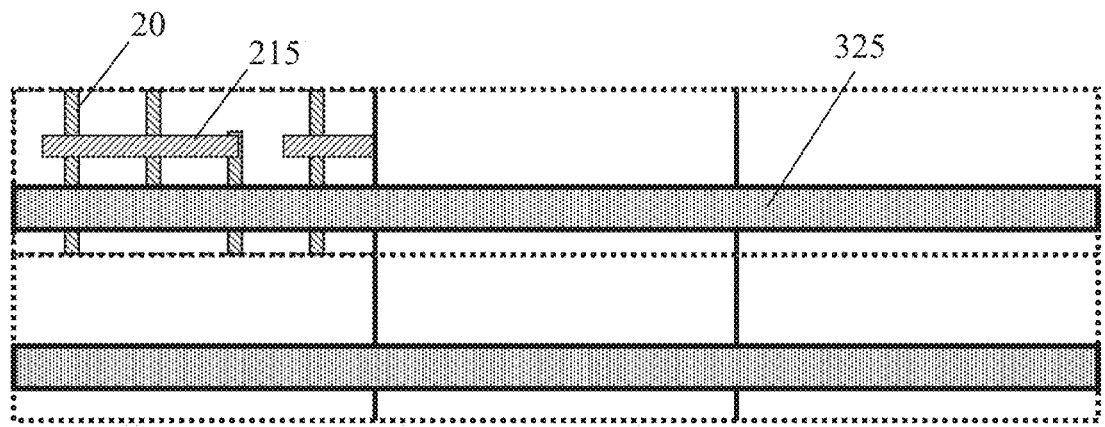

Then, as shown in FIG. 19, the third dummy patterns 325 are formed. FIG. 19 is a top view (plan view) and underlying fin structures 20 and gate electrodes 215 are shown in one of the SRAM unit cell for the purpose of explaining relative locations of the fin structure and the gate structures. A patterning operation including lithography and dry etching is performed to obtain the third dummy patterns 325.

In the patterning operation for the third dummy pattern 325, design data having one thin rectangular pattern extending in the X direction within one SRAM unit cell are prepared and a photo mask having opaque patterns corresponding to the thin rectangular pattern is prepared (when a positive photo resist is used). In the present embodiment, the thin rectangular pattern is disposed in the bottom half of the SRAM unit cell in the Y direction. In other words, on the photo mask (or the design data), only one pattern is included in one SRAM unit cell. By using this photo mask, resist patterns corresponding to the third dummy patterns 325 are formed on the blanket layer 300, and the third dummy patterns 325 are obtained by a dry etching operation.

Figure 20:
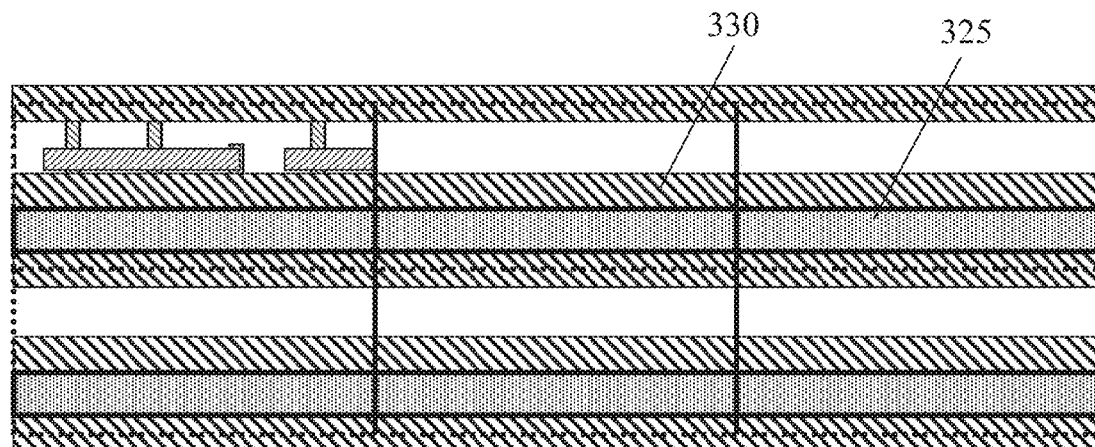

After the third dummy patterns 325 are formed, a blanket layer of a fifth material for a dummy hard mask layer is formed over the third dummy patterns 325 and the ILD layer 250, and anisotropic etching is performed on the fifth material layer, thereby obtaining second hard mask layer 330 as sidewall spacer layers, as shown in FIG. 20. The thickness of the fifth material layer is in a range from about 2 nm to about 70 nm in some embodiments.

Figure 21:
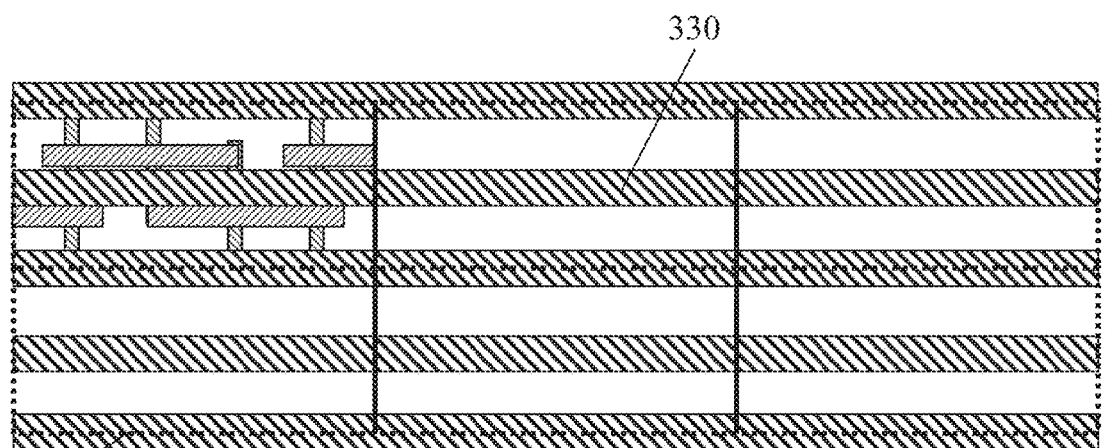

Then, as shown in FIG. 21, the third dummy patterns 325 are removed, thereby leaving the dummy hard mask patterns 330 over the ILD layer 250. The width of the dummy hard mask pattern 330 at the bottom thereof in the Y direction is in a range from about 2 nm to about 70 nm in some embodiments and is in a range from about 10 nm to about 40 nm in other embodiments.

As shown in FIG. 21, the dummy hard mask patterns are formed on the cell boundary CELB in the X direction (top side and bottom side of the cell boundary) and inside each SRAM unit cell. In other words, each SRAM unit cell includes one dummy hard mask pattern having a full width and two dummy hard mask patterns having half of the full width.

Figure 22:
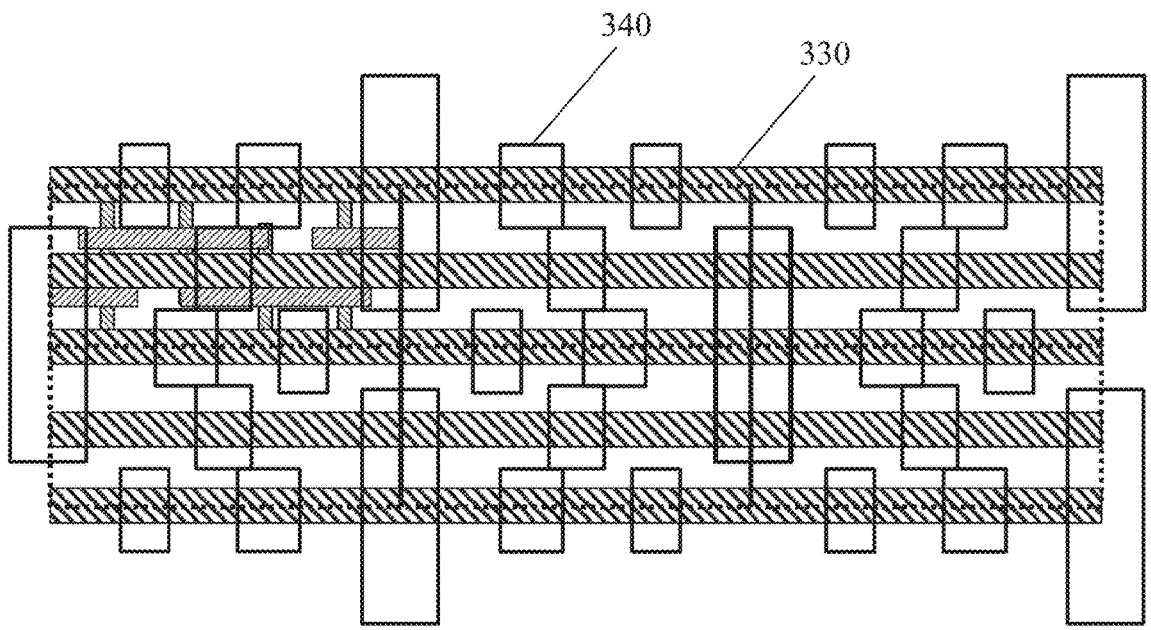
Figure 23A:
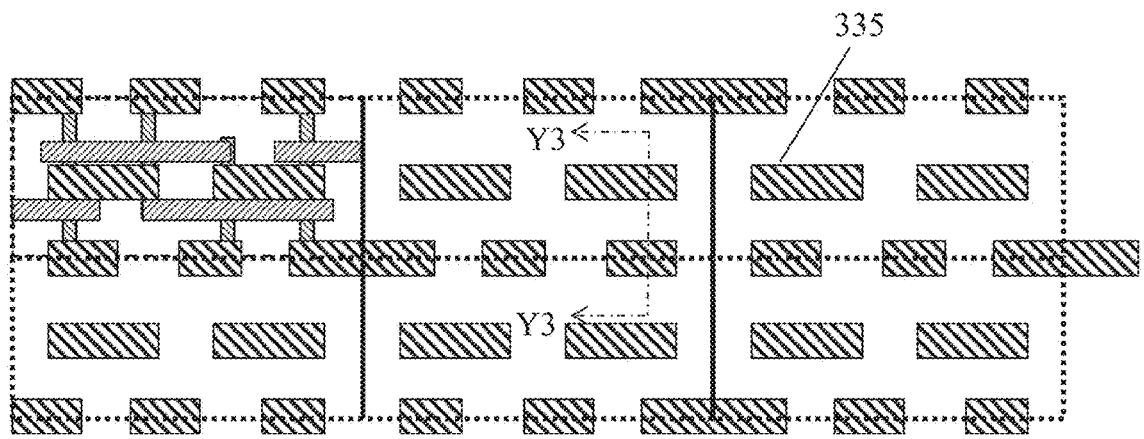
Figure 23B:
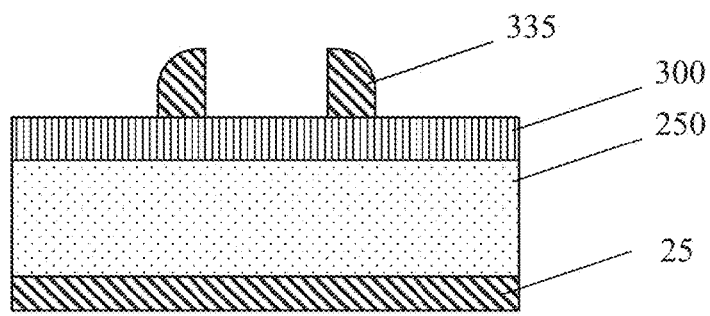

As shown in FIGS. 22, 23A and 23B, a patterning operation is performed to "cut" or "divide" the dummy hard mask patterns 330 so as to correspond to the desired contact bar pattern.

A resist layer is formed over the second hard mask patters 330, and a lithography operation is performed on the resist layer to form openings 340, as shown in FIG. 22.

In the lithography operation, design data having opening patterns substantially corresponding to the openings 360 are prepared and a photo mask having transparent patterns corresponding to the opening patterns is prepared (when a positive photo resist is used).

Then, a dry etching operation is performed to cut (or divide) the dummy hard mask patterns 330 thereby forming "cut" dummy hard mask pattern (plural pieces of the dummy hard mask patterns) 335 as shown in FIGS. 23A and 23B. FIG. 23B is a cross sectional view along line Y3-Y3 of FIG. 23A. The shapes and locations of the "cut" dummy hard mask patterns 335 substantially correspond to the contact bars that are subsequently formed.

Figure 24:
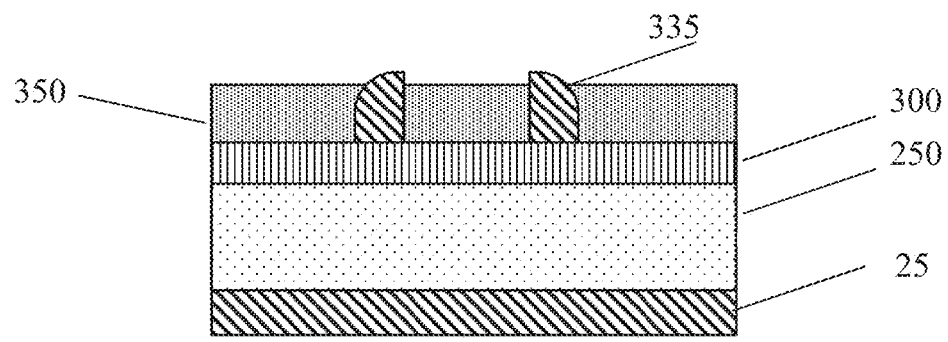

Then, as shown in FIG. 24, a reversing layer 350 is formed over the layer 330 and between the dummy hard mask patterns 335. The deposition process is designed to keep the top portion of the dummy hard mask pattern 335 exposed, as shown in FIG. 24. The reversing layer 350 includes one or more layers of silicon oxide, silicon nitride, silicon carbide (SiC), or SiON. Alternatively, the reversing layer 350 may include polysilicon, photo resist, polymer, bottom anti-reflect coating (BARC), metals and other suitable materials. In the present embodiment, the material of the reversing layer 350 is chosen to withstand a subsequent etching process to remove the dummy hard mask pattern 335. The deposition of the reversing layer 350 is performed by techniques, such as CVD, PVD, spin-coating, epitaxially growth, thermal growth or other appropriated deposition techniques.

In order to expose the top portion of the dummy hard mask pattern 335, the deposition process may be a selective depositing process with a suitable thickness target. In the selective deposition process, the reversing layer 350 is formed on the layer 300 between the dummy hard mask patterns 335 but is not formed on the dummy hard mask patterns 335. And the thickness of the reversing layer 350 is controlled to ensure the top portion of the dummy hard mask pattern 335 remain being exposed. Alternatively, a non-selective deposition process may be performed, such as a spin-coating process. As an example, with a proper thickness target of the spin-coating process, the top portion of the dummy hard mask pattern 335 may remain exposed. In the spin-coating process, the thickness of the spin-coating material may be controlled by several factors, such as spin-on material type and the spin speed.

Further alternatively, a non-selective and non-spin-coating deposition process may be performed to deposit the reversing layer 350 over the layer 300 and the dummy hard mask pattern 335. An etch back process may be applied to remove excessive the reversing layer 350 and expose the top portion of the dummy hard mask pattern 335. As an example, a chemical mechanical polishing (CMP) process is performed to remove a portion of reversing layer 350 such that the dummy hard mask pattern 335 is exposed. In the depicted embodiment, the reversing layer 350 includes polysilicon, amorphous-Si, or a refractory metal formed by a deposition technique, such as CVD or PVD. An etch-back or a CMP process may be performed thereafter to keep the top portion of the dummy hard mask pattern 335 exposed.

Figure 25A:
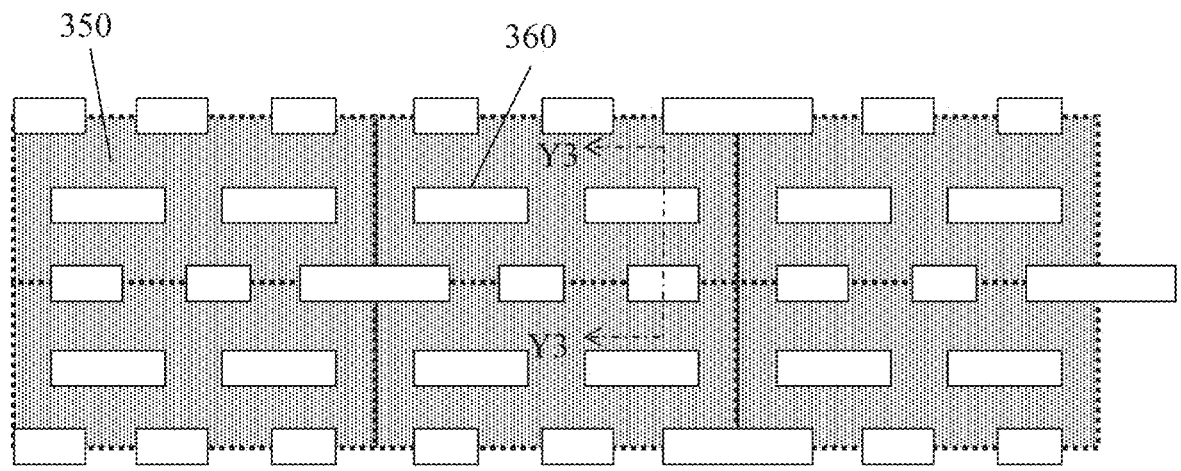
Figure 25B:
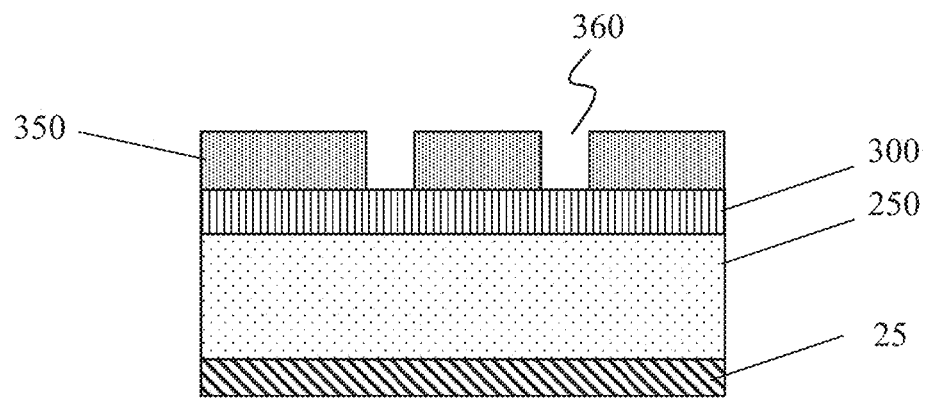

Next, as shown in FIGS. 25A and 25B, the dummy hard mask patterns 335 are removed, thereby forming openings 360. FIG. 25A is a top view and FIG. 25B is a cross sectional view along line Y3-Y3 of FIG. 25A.

The dummy hard mask pattern 335 may be removed by dry etching, wet etching, or a combination thereof. An adequate etch selectivity of the removing process minimizes loss of the sidewall of the reversing layer 350, and results in a relatively vertical profile for the opening 360 with substantially the same width as the removed dummy hard mask pattern 335. The dimensions of the openings 360 substantially define the dimensions of the contact bars in a subsequent process.

Figure 26:
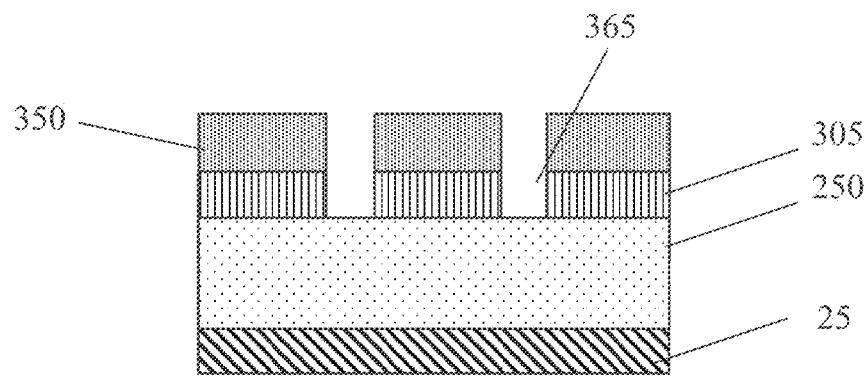

Then, by using the reversing layer 350 with the openings 360 as an etching mask, the layer 300 is patterned into a third hard mask layer 305 with openings 365, as shown in FIG. 26. The etching process may be anisotropic etching that forms a relatively vertical profile with substantially the same width/length as the opening 360, thereby leaving third hard mask layer 305. Then, the reversing layer 350 is removed by dry etching and or wet etching.

Figure 27A:
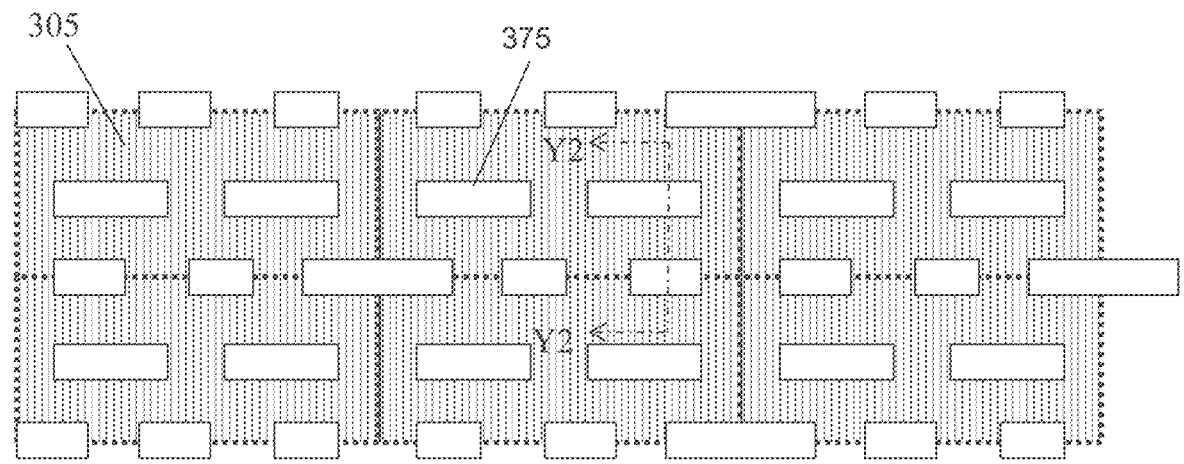
Figure 27B:
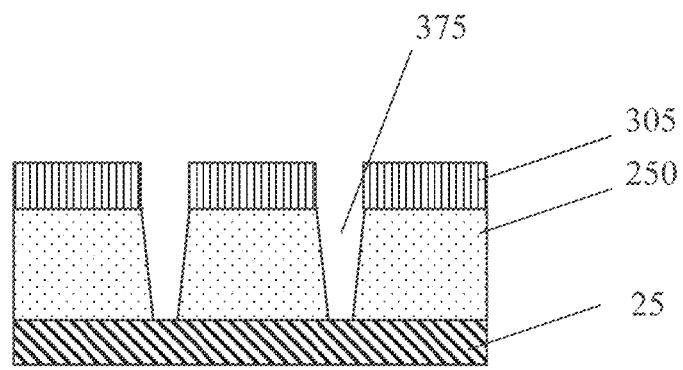

Next, as shown in FIGS. 27A and 27B, the ILD layer 250 is etched by using the third hard mask layer 305 as an etching mask, thereby forming via holes/openings 375, which reach the S/D epitaxial layer 25.

Figure 28A:
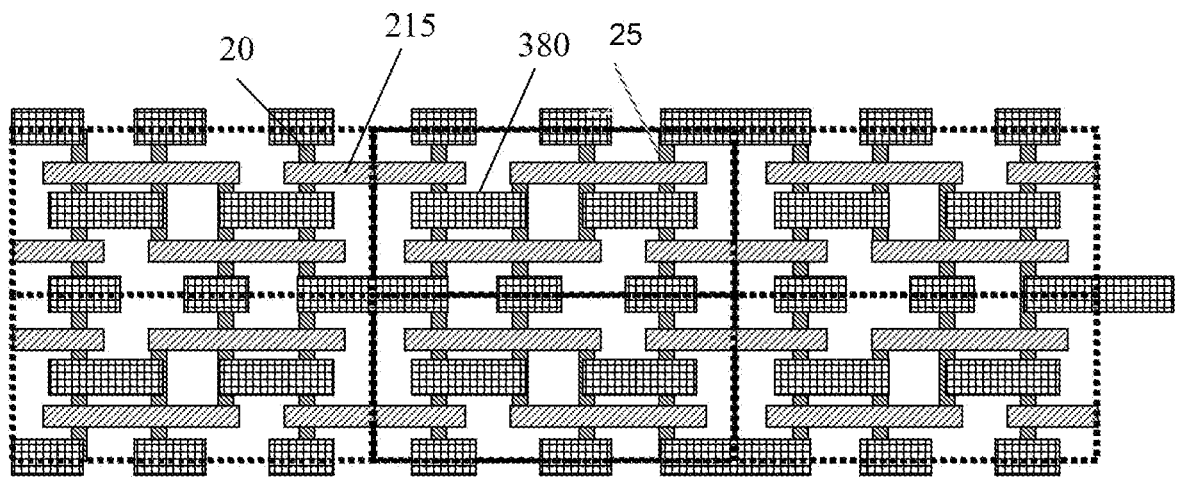
Figure 28B:
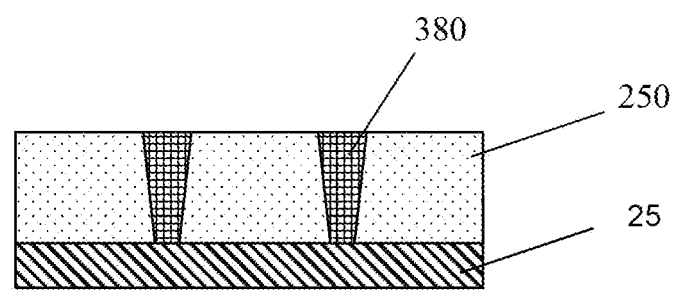

After the formation of the via holes/openings 375, conductive material including one or more of Cu, W, Al, AlCu, TiN, TiW, Ti, Co, Ni, TaN, Ta, or other refractory metal is filled in the via holes/openings 375. After a planarization operation, such as CMP, the contact bars 380 are formed, as shown in FIGS. 28A and 28B.

In the above embodiment, the layer 300 is formed over the ILD layer 250 and is subsequently used as third hard mask layer 305. In other embodiments, the layer 300 is not formed and the ILD layer 250 is etched by using the reversing layer 350 with the openings 360 as an etching mask.

The various embodiments or examples described herein offer several advantages over the existing art. For example, in the present disclosure, by using two photo masks in two photo lithography operations, gate electrode patterns and/or openings in the ILD layer for contact bars with smaller dimensions can be uniformly formed.

It will be understood that not all advantages have been necessarily discussed herein, no particular advantage is required for all embodiments or examples, and other embodiments or examples may offer different advantages.

In accordance with one aspect of the present disclosure, a method of manufacturing a static random access memory (SRAM) including a plurality of SRAM cells, comprises the following operations. An insulating layer is formed over a substrate. First dummy patterns are formed over the insulating layer. Sidewall spacer layers are formed, as second dummy patterns, on sidewalls of the first dummy patterns. The first dummy patterns are removed, thereby leaving the second dummy patterns over the insulating layer. After removing the first dummy patterns, each of the second dummy patterns is divided into plural pieces of the second dummy patterns. A mask layer is formed over the insulating layer and between the plural pieces of the second dummy patterns. After forming the mask layer, the plural pieces of the second dummy patterns are removed, thereby forming a hard mask layer having openings that correspond to the plural pieces of the second dummy patterns. The insulating layer is patterned by using the hard mask layer as an etching mask, thereby forming via openings in the insulating layer. A conductive material is filled in the via openings, thereby forming contact bars.

In accordance with another aspect of the present disclosure, a method of manufacturing a static random access memory (SRAM) including a plurality of SRAM cells, comprises the following operations. An insulating layer is formed over a substrate. A first mask layer is formed over the insulating layer. First dummy patterns are formed over the first mask layer. Sidewall spacer layers, as second dummy patterns, are formed on sidewalls of the first dummy patterns. The first dummy patterns are removed, thereby leaving the second dummy patterns over the first mask layer. After removing the first dummy patterns, each of the second dummy patterns is divided into plural pieces of the second dummy patterns. A second mask layer is formed over the first mask layer and between the plural pieces of the second dummy patterns. After forming the second mask layer, the plural pieces of the second dummy patterns are removed, thereby forming a first hard mask layer having openings that correspond to the plural pieces of the second dummy patterns. The first mask layer is patterned by using the first hard mask layer as an etching mask, thereby forming a second mask layer. The insulating layer is patterned by using the second hard mask layer as an etching mask, thereby forming via openings in the insulating layer. A conductive material is filled in the via openings, thereby forming contact bars.

In accordance with another aspect of the present disclosure, a method of manufacturing a static random access memory (SRAM) including a plurality of SRAM cells, comprises the following operations. A first insulating layer is formed over a substrate. A first layer is formed over the first insulating layer. First dummy patterns are formed over the first layer. Sidewall spacer layers, as second dummy patterns, are formed on sidewalls of the first dummy patterns. The first dummy patterns are removed, thereby leaving the second dummy patterns over the first mask layer. After removing the first dummy patterns, each of the second dummy patterns is divided into plural pieces of the second dummy patterns. The first layer is patterned by using the plural pieces of the second dummy patterns as an etching mask, thereby forming gate patterns.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming source/drain epitaxial layers;
   forming a first layer over the source/drain epitaxial layers, wherein the first layer includes a lower layer and an upper layer made of different material than the lower layer;
   forming a dummy pattern over the first layer, wherein the dummy pattern is formed of a metal material, TiN, polysilicon, amorphous silicon, silicon oxide, or silicon nitride;
   forming a second layer over the first layer and around the dummy pattern;
   removing the dummy pattern, thereby forming a first opening in the second layer;
   forming a via opening in the first layer by etching the upper layer through the first opening in the second layer, thereby forming a second opening;
   removing the second layer; and
   etching the lower layer through the second opening in the upper layer; and
   forming a conductive pattern by filling a conductive material in the via opening, thereby connecting adjacent source/drain epitaxial layers.

2. The method of claim 1, wherein the lower layer includes one or more layers of SiCOH, SiOC, or an organic material.

3. The method of claim 1, wherein the upper layer includes one or more layers of TiN, poly-Si, amorphous Si, silicon oxide, or silicon nitride.

4. The method of claim 1, wherein the second layer includes one or more layers of silicon oxide, silicon nitride, silicon carbide (SiC), or SiON.

5. The method of claim 1, wherein the second layer includes one or more layers of a photoresist, a polymer, or a bottom anti-reflective coating (BARC) material.

6. The method of claim 1, wherein the second layer is formed such that a top of the dummy pattern is exposed.

7. The method of claim 1, wherein the first layer and the second layer are formed of different materials.

8. A method of manufacturing a semiconductor device, the method comprising:
- forming source/drain regions;
- forming one or more insulating layers over the source/drain regions;
- forming a first pattern over the insulating layers, wherein the first pattern is formed of a metal material, TiN, poly silicon, amorphous silicon, silicon oxide, or silicon nitride;
- forming a second pattern over the insulating layers, the second pattern having a reversed tone of the first pattern;
- patterning the one or more insulating layers by using the second pattern as an etching mask, thereby forming first and second openings; and
- forming a first conductive pattern by filling a conductive material in the first opening, and a second conductive pattern by filling the conductive material in the second opening,
- wherein:
  - the semiconductor device includes a static random access memory (SRAM), and
  - the first conductive pattern connects a drain of a first pass-gate transistor, a drain of first n-type transistor and a drain of first p-type transistor, and
  - the second conductive pattern is connected to a source of the first pass gate transistor or a source of the first n-type transistor.

9. The method of claim 8, wherein the second pattern is made of different material than the first pattern.

10. The method of claim 8, wherein the forming one or more insulating layers comprises forming a first insulating material layer over the source/drain regions, and forming a second insulating material layer made of a different material than the first insulating material layer over the first insulating material layer.

11. The method of claim 8, wherein the second pattern includes one or more layers of silicon oxide, silicon nitride, silicon carbide (SiC), or SiON, a photoresist, a polymer or a bottom anti-reflective coating (BARC) material.

12. The method of claim 8, wherein the second pattern includes one or more layers of silicon oxide, silicon nitride, silicon carbide (SiC), or SiON.

13. The method of claim 8, wherein the second pattern includes one or more layers of a photoresist, a polymer, or a bottom anti-reflective coating (BARC) material.

14. The method of claim 8, wherein the one or more insulating layers include one or more layers of SiCOH, SiOC, or an organic material.

15. A method of manufacturing a semiconductor device, the method comprising:
- forming source/drain epitaxial layers;
- forming a first layer over the source/drain epitaxial layers;
- forming a first dummy pattern and a second dummy pattern over the first layer, wherein the first and second dummy patterns are formed of a metal material, TiN, polysilicon, amorphous silicon, silicon oxide, or silicon nitride;
- forming a second layer over the first layer and around the first and second dummy patterns;
- removing the first and second dummy patterns, thereby forming a first opening and a second opening in the second layer;
- forming a first via opening in the first layer and a second via opening by etching the first layer through the first opening and the second opening, respectively; and
- forming a first conductive pattern by filling a conductive material in the first via opening, thereby connecting adjacent source/drain epitaxial layers, and a second conductive pattern by filling the conductive material in the second via opening,
- wherein:
  - the semiconductor device includes a static random access memory (SRAM), and the first conductive pattern connects a drain of a first pass-gate transistor, a drain of first n-type transistor and a drain of first p-type transistor, and
  - the second conductive pattern connects a drain of a second pass-gate transistor, a drain of second n-type transistor and a drain of second p-type transistor.

16. The method of claim 15, wherein the first layer and the second layer are formed of different materials.

17. The method of claim 15, wherein the first layer includes one or more layers of SiCOH, SiOC, or an organic material.

18. The method of claim 15, wherein the first layer includes one or more layers of TiN, poly-Si, amorphous Si, silicon oxide, or silicon nitride.

19. The method of claim 15, wherein the second layer includes one or more layers of silicon oxide, silicon nitride, silicon carbide (SiC), or SiON.

20. The method of claim 15, wherein the second layer includes one or more layers of a photoresist, a polymer, or a bottom anti-reflective coating (BARC) material.

* * * * *